United States Patent
Song et al.

(10) Patent No.: US 11,506,810 B2
(45) Date of Patent: Nov. 22, 2022

(54) MINIATURIZED NMR TOOL ELECTRONICS

(71) Applicant: Schlumberger Technology Corporation, Sugar Land, TX (US)

(72) Inventors: Yi-Qiao Song, Newton Center, MA (US); Yiqiao Tang, Belmont, MA (US); Shin Utsuzawa, Sugar Land, TX (US); Tancredi Botto, Cambridge, MA (US); Irfan Bulu, Minneapolis, MN (US); Martin Hurlimann, Newton, MA (US)

(73) Assignee: SCHLUMBERGER TECHNOLOGY CORPORATION, Sugar Land, TX (US)

( * ) Notice: Subject to any disclaimer, the term of this patent is extended or adjusted under 35 U.S.C. 154(b) by 0 days.

(21) Appl. No.: 17/419,014

(22) PCT Filed: Dec. 23, 2019

(86) PCT No.: PCT/US2019/068278
§ 371 (c)(1),
(2) Date: Jun. 28, 2021

(87) PCT Pub. No.: WO2020/139813
PCT Pub. Date: Jul. 2, 2020

(65) Prior Publication Data
US 2022/0120931 A1    Apr. 21, 2022

Related U.S. Application Data

(60) Provisional application No. 62/785,864, filed on Dec. 28, 2018.

(51) Int. Cl.
*G01V 3/32* (2006.01)
*G01R 33/34* (2006.01)
*G01R 33/36* (2006.01)

(52) U.S. Cl.
CPC ......... *G01V 3/32* (2013.01); *G01R 33/34092* (2013.01); *G01R 33/3614* (2013.01)

(58) Field of Classification Search
CPC . G01V 3/32; G01R 33/34092; G01R 33/3614
See application file for complete search history.

(56) References Cited

U.S. PATENT DOCUMENTS

| 5,153,514 A | 10/1992 | Griffin et al. |
| 6,118,272 A | 9/2000 | Taicher et al. |

(Continued)

FOREIGN PATENT DOCUMENTS

| WO | 2009108326 A2 | 9/2009 |
| WO | 2015066005 A1 | 5/2015 |

OTHER PUBLICATIONS

Ha, D., Paulsen, J. L., Sun, N., Song, Y.-Q., & Ham, D. (2014). Scalable NMR spectroscopy with semiconductor chips. Proceedings of the National Academy of Sciences, 111(33), 11955-11960.

(Continued)

*Primary Examiner* — Gregory H Curran
(74) *Attorney, Agent, or Firm* — Trevor G. Grove

(57) ABSTRACT

An NMR well logging tool is provided that includes a sensor and associated electronic circuitry. The sensor includes an array of RF antenna elements. The electronic circuitry includes at least one low-power integrated circuit and a plurality of high-power modules corresponding the RF antenna elements of the array. Each high-power module is coupled to a corresponding RF antenna element of the array and includes an RF amplifier that is configured to amplify RF pulses generated by the at least one low-power integrated circuit and supplied thereto for transmission by the corresponding antenna element. In embodiments, the RF amplifier of each high-power module can include an H-bridge circuit or other suitable RF amplifier.

19 Claims, 20 Drawing Sheets

(56) References Cited

U.S. PATENT DOCUMENTS

| | | | |
|---|---|---|---|
| 7,251,592 B1* | 7/2007 | Praisner | G06F 30/23 |
| | | | 703/2 |
| 7,733,086 B2 | 6/2010 | Prammer et al. | |
| 8,988,076 B2 | 3/2015 | Mandal et al. | |
| 9,392,681 B2 | 7/2016 | Botto | |
| 2011/0091987 A1 | 4/2011 | Weissleder et al. | |
| 2013/0234704 A1 | 9/2013 | Hurlimann et al. | |
| 2016/0274204 A1 | 9/2016 | Song et al. | |
| 2017/0248732 A1 | 8/2017 | Song et al. | |
| 2018/0252839 A1* | 9/2018 | Knizhnik | G01V 3/32 |
| 2019/0391292 A1* | 12/2019 | Zhou | G01R 33/34007 |

OTHER PUBLICATIONS

Hassibi, A., Babakhani, A., & Hajimiri, A. (2009). A Spectral-Scanning Nuclear Magnetic Resonance Imaging (MRI) Transceiver. IEEE Journal of Solid-State Circuits, 44(6), 1805-1813.

Anders, J. San Giorgio, P.; Boero, G., An integrated CMOS receiver chip for NMR-applications, Custom Integrated Circuits Conference, 2009. CICC '09. IEEE, Sep. 13-16, 2009; pp. 471-474.

Jens Anders, Paul San Giorgio, Giovanni Boero, A fully integrated IQ-receiver for NMR microscopy, Journal of Magnetic Resonance, vol. 209, Issue 1, Mar. 2011, pp. 1-7.

International Search Report and Written Opinion issued in PCT Application PCT/US2019/068278, dated Apr. 22, 2020 (11 pages).

International Preliminary Report on Patentability issued in PCT Application PCT/US2019/068278 dated Jul. 8, 2021, 8 pages.

* cited by examiner

MINIATURIZED NMR TOOL ELECTRONICS

CROSS-REFERENCE TO RELATED APPLICATION(S)

The present application is a National Stage of International Application No. PCT/US2019/068278, filed Dec. 23, 2019, which claims priority from U.S. Provisional Application No. 62/785,864, entitled "MINIATURIZED NMR TOOL ELECTRONICS," filed on Dec. 28, 2018, herein incorporated by reference in their entirety.

FIELD

The present application relates generally to NMR (nuclear magnetic resonance) systems and methods.

BACKGROUND

Nuclear Magnetic Resonance (NMR) spectrometers have been in use for many years and can be used to provide imaging and/or analysis of a sample being tested. In general, a typical single channel NMR spectrometer is comprised of three main components: a pulse sequencer, an NMR transmitter, and an NMR receiver. The NMR transmitter and the NMR receiver both interface to an external radio frequency (RF) antenna (e.g., coil) that is typically part of an NMR probe that receives the sample. An external magnet can also be provided to provide a static magnetic field (typically referred to as the $B_0$ field) to the sample during NMR experiments. The pulse sequencer and the NMR transmitter cooperate to supply a train of pulses of an oscillating RF signal to the external RF antenna in order to excite macroscopic nuclear spins in the sample. The NMR receiver receives NMR signals detected by the external RF antenna and amplifies the received NMR signals with low noise and high gain. The NMR signals produced by the NMR receiver are processed by signal processing circuitry (typically involving digitization by an analog-to-digital converter and data processing by a data processor) in order to derive useful physical and chemical information.

NMR logging is an established type of NMR measurement wherein an NMR spectrometer is lowered into a borehole in the earth, and NMR measurements are performed to determine properties within and/or surrounding the borehole. However, existing NMR logging spectrometers have a number of drawbacks. For example, the downhole sensor package designed to fit within the borehole can be large in size.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

In embodiments of the subject disclosure, an NMR well logging tool is provided that includes a sensor and associated electronic circuitry. The sensor includes an array of RF antenna elements. The sensor can also include at least one magnet (such as one or more permanent magnets). The sensor can also include a housing that at least partially encloses the array of RF antenna elements, wherein at least part of the electronic circuitry is enclosed within the housing. The electronic circuitry includes at least one low-power integrated circuit and a plurality of high-power modules corresponding to the RF antenna elements of the array. Each high-power module is coupled to a corresponding RF antenna element of the array and includes an RF amplifier that is configured to amplify RF pulses generated by the at least one low-power integrated circuit and supplied thereto for transmission by the corresponding antenna element.

In embodiments, the RF amplifier of each high-power module can include an H-bridge circuit.

In embodiments, the H-bridge circuit can include four switching transistors that are specified to operate at downhole temperatures up to 175° C. For example, the four switching transistors can be realized from large bandgap semiconductor materials, such as silicon-carbide (SiC), gallium-nitride (GaN), or other hybrid semiconductor material.

In embodiments, the H-bridge circuit can be operably coupled to a direct-current power supply that supplies a DC high voltage power supply signal of at least 50 volts.

In embodiments, at least one of the plurality of high-power modules can be realized by an integrated circuit, multi-chip module or small-size printed circuit board.

In embodiments, the at least one low-power integrated circuit can include one or more pulse sequence generator circuits and a plurality of RF transmitter circuits corresponding to the plurality of high-power modules. Each RF transmitter circuit can be configured to generate a low-power RF oscillating signal under control of the at least one pulse sequence generator circuit for supply to the RF amplifier of the corresponding high-power module.

In embodiments, the at least one low-power integrated circuit can include a single low-power integrated circuit that includes a pulse sequence generator circuit and a plurality of RF transmitter circuits corresponding to the plurality of high-power modules. Each RF transmitter circuit can be configured to generate a low-power RF oscillating signal under control of the pulse sequence generator circuit for supply to the RF amplifier of the corresponding high-power module.

In embodiments, the at least one low-power integrated circuit includes a plurality of low-power integrated circuits corresponding to the plurality of high-power modules, wherein each low-power integrated circuit includes a pulse sequence generator and an RF transmitter circuit operably coupled to a corresponding high-power module, wherein the RF transmitter circuit is configured to generate a low-power RF oscillating signal under control of the pulse sequence generator for supply to the RF amplifier of the corresponding high-power module.

In embodiments, the operation of the plurality of low-power integrated circuits can be synchronized by timing control signals communicated therebetween.

In embodiments, each high-power module can further include a duplexer circuit operably coupled between the RF amplifier of the high-power module and the corresponding RF antenna element of the array.

In embodiments, the at least one low-power integrated circuit can further include a plurality of RF receiver circuits corresponding to the plurality of high-power modules. The duplexer circuit of each high-power module can be operably coupled between the corresponding RF antenna element of the array and the corresponding RF receiver circuit. Each RF receiver circuit can be configured to receive NMR signal components detected by the RF antenna element coupled to the duplexer circuit of the corresponding high-power module.

In embodiments, the at least one low-power integrated circuit can include a single low-power integrated circuit that includes a plurality of RF receiver circuits corresponding to the plurality of high-power modules. Each RF receiver circuit can be configured to receive NMR signal components detected by the RF antenna element coupled to the duplexer circuit of the corresponding high-power module.

In embodiments, the at least one low-power integrated circuit can include a plurality of low-power integrated circuits corresponding to the plurality of high-power modules. Each low-power integrated circuit can include an RF receiver circuit operably coupled to a corresponding high-power module. The RF receiver circuit can be configured to receive NMR signal components detected by the RF antenna element coupled to the duplexer circuit of the corresponding high-power module.

In embodiments the NMR logging tool can further include a control module operably coupled to the plurality of low-power integrated circuits. The control module can be configured to store NMR data corresponding to the received NMR signal components for the plurality of low-power integrated circuits in at least one memory device. In one embodiment, the control module can be configured to store NMR data corresponding to the received NMR signal components for the plurality of low-power integrated circuits in different memory devices corresponding to the plurality of low-power integrated circuits.

In one embodiment, the at least one low-power integrated circuit can be an ASIC or a plurality of ASICs.

In embodiment, each RF antenna element of the array can include an elongate ferrite core, an elongate or strip conductor element that extends along a length dimension of the ferrite core on one side of the ferrite core, and an exterior shield that surrounds the RF antenna element with an opening that exposes the elongate conductor. The RF antenna element can be configured to produce an oscillating RF magnetic field in the space above the opening defined by the exterior shield.

In embodiments, the oscillating RF magnetic field produced by the RF antenna element is transverse to both a direction normal to the elongate conductor element and a direction parallel to the longitudinal direction of the elongate conductor element.

In embodiments, each RF antenna element of the array can further include at least one conductor element that wraps around an end of the ferrite core and that is at least partially covered by the exterior shield.

In embodiments, each RF antenna element of the array can further include a conductor element that is disposed on a side of the ferrite core opposite the exposed elongate conductor element and covered by the exterior shield element.

In embodiments, each RF antenna element of the array can further include at least one interior shield that is disposed on a side of the ferrite core opposite the exposed elongate conductor element and covered by the exterior shield.

Further features and advantages of the subject application will become more readily apparent from the following detailed description when taken in conjunction with the accompanying drawings.

BRIEF DESCRIPTION OF THE DRAWINGS

The present application is further described in the detailed description which follows, and in reference to the noted plurality of drawings by way of non-limiting examples of embodiments of the present application, in which like reference numerals represent similar parts throughout the several views of the drawings.

FIG. 10A is a perspective schematic view of two RF antenna elements of the array shown in FIG. 10B, where the view of RF antenna element on the left hand side of FIG. 10A is a partial-cutaway view with the exterior shield of RF antennae removed to shown the interior components of each RF antenna element; FIG. 10B is a perspective view of the array of antenna elements, which include four RF antenna elements (labeled "RF Antenna 1", "RF Antenna 2", "RF Antenna 3", and "RF Antenna 4"; and FIG. 10C is a partial cross-sectional view through the interior components of the array of RF antennae shown in FIG. 10B;

DETAILED DESCRIPTION

Figure 1:
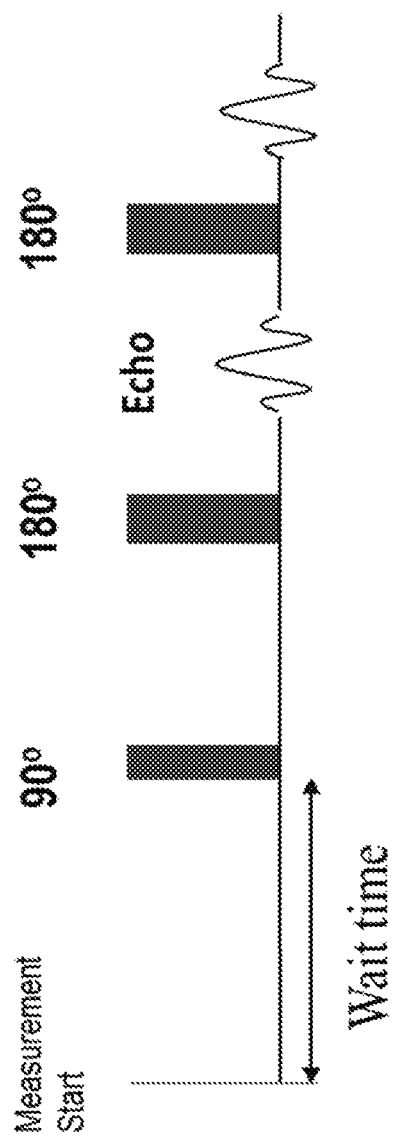
FIG. 1 is a schematic diagram of an NMR pulse sequence.

The particulars shown herein are by way of example and for purposes of illustrative discussion of the embodiments of the subject disclosure only and are presented in the cause of providing what is believed to be the most useful and readily understood description of the principles and conceptual aspects of the subject disclosure. In this regard, no attempt is made to show structural details in more detail than is necessary for the fundamental understanding of the subject disclosure, the description taken with the drawings making apparent to those skilled in the art how the several forms of the subject disclosure may be embodied in practice. Furthermore, like reference numbers and designations in the various drawings indicate like elements.

NMIR has been used to study rocks and other porous media for many years. The key physics that enable this is the sensitivity of spin relaxation and diffusion to pore size. NMR well logging is an important characterization tool for subsurface formation and reservoirs. However, the tools are long primarily due to the complexity of the electronics and the high power the tools use to operate. This disclosure describes a new design of the NMR electronics and RF antenna which reduces size of the well logging NMR tool.

Nuclear Magnetic Resonance (NMR) is a routinely used technique for reservoir characterization due to its capability of measuring the hydrogen nuclei in the fluids. As both water and hydrocarbons like oil and gas include hydrogen nuclei, they can be measured and quantified by NMR tools. Furthermore, NMR measurement of relaxation times ($T_1$ and $T_2$) and diffusion coefficients enable an understanding of the dynamics of these fluids, resulting in the interpretation of their physical state (i.e. free or bound), the sizes of the pores they are confined in, the viscosity and type of hydrocarbons and the permeability of the rock system.

NMR relaxation such as measured by T2 has been shown to be directly proportional to the surface-to-volume ratio of a porous material, $$1/T_2 = \rho \cdot S/V_p \qquad \text{Eqn. (1)}$$

where S is the total surface area of the material, $V_p$ is the pore volume, and p is the surface relaxivity.

Surface relaxivity p is a quantity (in micron/second) that defines the strength of the surface relaxation phenomenon. Because of this relationship, NMR is extensively used in petroleum exploration to obtain estimates of porosity, pore size, bound fluids, permeability, and other rock and fluid properties (i.e., "petrophysical data"). For example, it is known that the T2 distribution is closely related to the pore size distribution. Reservoir rocks often exhibit a wide range of T2 due to the difference in pore sizes, with observed T2s from several seconds down to tens of microseconds. Typically, signals at long T2 (e.g. >100 milliseconds) are from large pores and such fluids are considered to be producible. For shorter T2 signals, 3-50 milliseconds, the fluids are often considered to be bound by capillary force of the pores. For example, in sandstone rocks, signals at T2 below 30 ms are considered bound by capillary force and will not produce. Thus, a cutoff value, $T2_{cut}$, e.g., $T2_{cut}=30$ ms, can be used to calculate the bound fluid volume $$BFV = \int_{T2min}^{T2cut} f(T2) dT2 \qquad \text{Eqn. (2)}$$

where f(T2) is the T2 distribution, and T2 mm is the minimum T2 obtained in the T2 distribution.

If f(T2) is the T2 distribution for the fully saturated sample, then the porosity Ø can be obtained by integrating f(T2) according to $$\emptyset = \int_{T2min}^{T2max} f(T2) dT2 \qquad \text{Eqn. (3)}$$

where $T2_{max}$ is the maximum T2 exhibited in the sample. Signals with even shorter T2, such as T2<3 milliseconds, are often due to clay bound water or viscous (heavy) hydrocarbon. Some rocks contain a significant amount of kerogen that is solid organic matter and may exhibit T2s down to tens of microseconds.

NMR measurements are acquired using specially designed data acquisition schemes (called pulse sequences) which describe the timings of transmission and reception of electromagnetic signals. The pulse sequence for the measurement of T2 relaxation time distribution is commonly referred to as the CPMG echo train and is shown in FIG. 1. The CPMG echo train consists of an initial idle time or wait time to allow the nuclei in formation fluids to come to equilibrium with the magnetic field induced by the permanent magnet of the tool. Thereafter, a series of radiofrequency pulses are applied using an antenna. Midway between two RF pulses, NMR signals called echoes are formed which are measured using the antenna. The amplitude of the echoes decay or attenuate with time. By fitting the echo amplitudes to a multi-exponential model, the T2 distribution is obtained.

In such an experiment, a train of echo signal is acquired. The signal amplitude, S, is measured as a function of the echo time, $t_{echo}$, (that is the time of the echo from the beginning of the first 90-degree pulse), $$t_{echo} = n * TE \qquad \text{Eqn. (4)}$$

where n is the number of echo and TE is the echo spacing (time between two adjacent 180-degree pulse). The signal amplitude then follows an exponential decay form $$S(t_{echo}) = S(0)\exp\left(-n * \frac{TE}{T_2}\right), \qquad \text{Eqn. (5)}$$

for a sample with a single T2. For many samples where a range of T2 is present, the total signal is a sum of all T2 components, $$S(t_{echo}) = \int dT_2 f(T_2) \exp\left(-n * \frac{TE}{T_2}\right), \qquad \text{Eqn. (6)}$$

where f(T2) is the T2 distribution function.

In a porous rock, pores are typically connected to form a continuous pore space. Fluids (such as water or oil) may flow through the pores when driven by pressure. The fluid often flows through large pores and then smaller pores and the flow properties are sensitive to the pore sizes. For example, the flow rate can be determined by the diameter of the flow channel and the fluid viscosity.

The NMR property values can be related to transverse relaxation time (T2) of hydrogen protons, which is often obtained by a CPMG pulse sequence. Other pulse sequences can also be used to obtain values for other NMR properties of the rock sample, such as inversion recovery sequence to obtain longitudinal relaxation time (T1) values, and pulsed field gradient experiment to obtain diffusion coefficient (D) values. Several other multi-dimensional experiments have also been used extensively in petroleum sciences to characterize two dimensional maps of NMR property values of the rock sample, such as inversion-recovery-CPMG experiment for a T1-T2 map, and a diffusion editing-CPMG experiment for a D-T2 map. These methods can all be performed at different capillary pressures to obtain a range of NMR properties of the rock sample.

NMR Well Logging Instrument Design

Well logging NMR systems employ a sensor and electronics. The sensor includes a magnet system and a set of RF antennae (possibly containing only a single element). The magnet system generates the static magnetic field (typically called B0) at the sample. The set RF antennae provide the oscillating magnetic field (typically called B1) when energized. The oscillating magnetic field is used to manipulate the spins in the sample. The set of RF antennae can also serve as detectors for the generated coherent magnetization.

The electronics of the well logging NMR systems typically include three elements: i) a pulse generator that is configured to generate arbitrary pulse sequences, ii) an RF transmitter circuit, and iii) an RF receiver circuit. The pulse generator synthesizes the NMR pulse sequences (such as the CPMG echo train shown in FIG. 1) with precise frequency, duration, phase and amplitude control. The output RF pulses of the pulse generator are usually of low power, such as 1 mW to 100 mW, which is often referred to as 0 dBm. To effectively manipulate the spins in the sample, stronger RF pulses are required. This is achieved by feeding the RF pulses generated by the pulse generator into the RF transmitter circuit that amplifies the low-power pulses to higher power pulses while respecting the RF phase, frequency and duration. The high power pulses produced by the RF transmitter circuit are typically 10 W to a few kW in power. The high power pulses produced by the RF transmitter circuit are supplied to the set of RF antennae for transmission to the sample whereby the transmitted RF pulses manipulate the spins in the sample. The set of RF antennae are also configured to detect an NMR signal that is supplied to the RF receiver circuit. The RF receiver circuit typically includes a pre-amplifier, a variable gain amplifier, phase detectors, a demodulator, and filters. The resulting processed NMR signal is typically digitized using Analog-to-Digital convertors (ADC) and analyzed by a computer, or microprocessors.

The overall length of an NMR well logging tool has contributions from both the sensor and the electronics. The length of the sensor typically scales with the length of the formation that is probed by the measurement, taking into consideration many factors, such as measurement physics, logging speed and SNR. Given performance specifics, it is desirable to miniaturize a footprint of the electronics so that other types of sensors can be effectively integrated on a single tool string. A shorter tool string is particularly valuable in logging-while-drilling applications. It also has benefits in improved shipping and handling. In current logging tools, the electronics cartridge is very long, such as, for example, 10 ft long.

In current logging tools, a field-programmable gate array (FPGA) can be used to generate digital control signals for the pulse sequence that specify the duration, phase, frequency of the pulses and delays. These control signals in turn drive the analog circuits/components (frequency source, mixer, modulator, gate switches, etc.) to synthesize the RF pulse sequence. The low-power RF pulses are further input to the power amplifier, providing the high current to drive an RF antenna. The circuit uses many discrete components, including capacitors and inductors that are bulky and have large footprints, which are distributed in many printed circuit boards.

One difficulty with electronics for downhole well-logging is the high temperatures that can be experienced in the downhole environment. For example, current logging tools can be specified to work at temperatures up to 175° C. In contrast, a majority of the electronic components on the market are designed for room temperature operation with temperature specifications up to 85° C. In recent years, more high-temperature components became available with the rise of the electric car industry, yet these parts typically operate only up to 125° C. Components qualified for operation at 175° C. are very rare.

In recent years, large bandgap semiconductors, such as silicon-carbide (SiC) and gallium-nitride (GaN) based transistors and integrated circuits, have experienced rapid development. Due to the large bandgaps, these devices exhibit superior high-temperature performance in operating frequency, switching speed, and high-power performance.

In an embodiment, a miniaturized NMR well-logging tool is provided that includes a custom-built low-power integrated circuit and a high-power module or chipset. We will outline the major subsystems of an NMR logging tool to illustrate the approach to a miniaturized tool. The key to this approach is a radically smaller footprint required for the electronics of the NMR logging tool. As discussed below, it further enables additional variances of the sensor, including the use of multiple RF antenna elements.

Sensor

Figure 2:
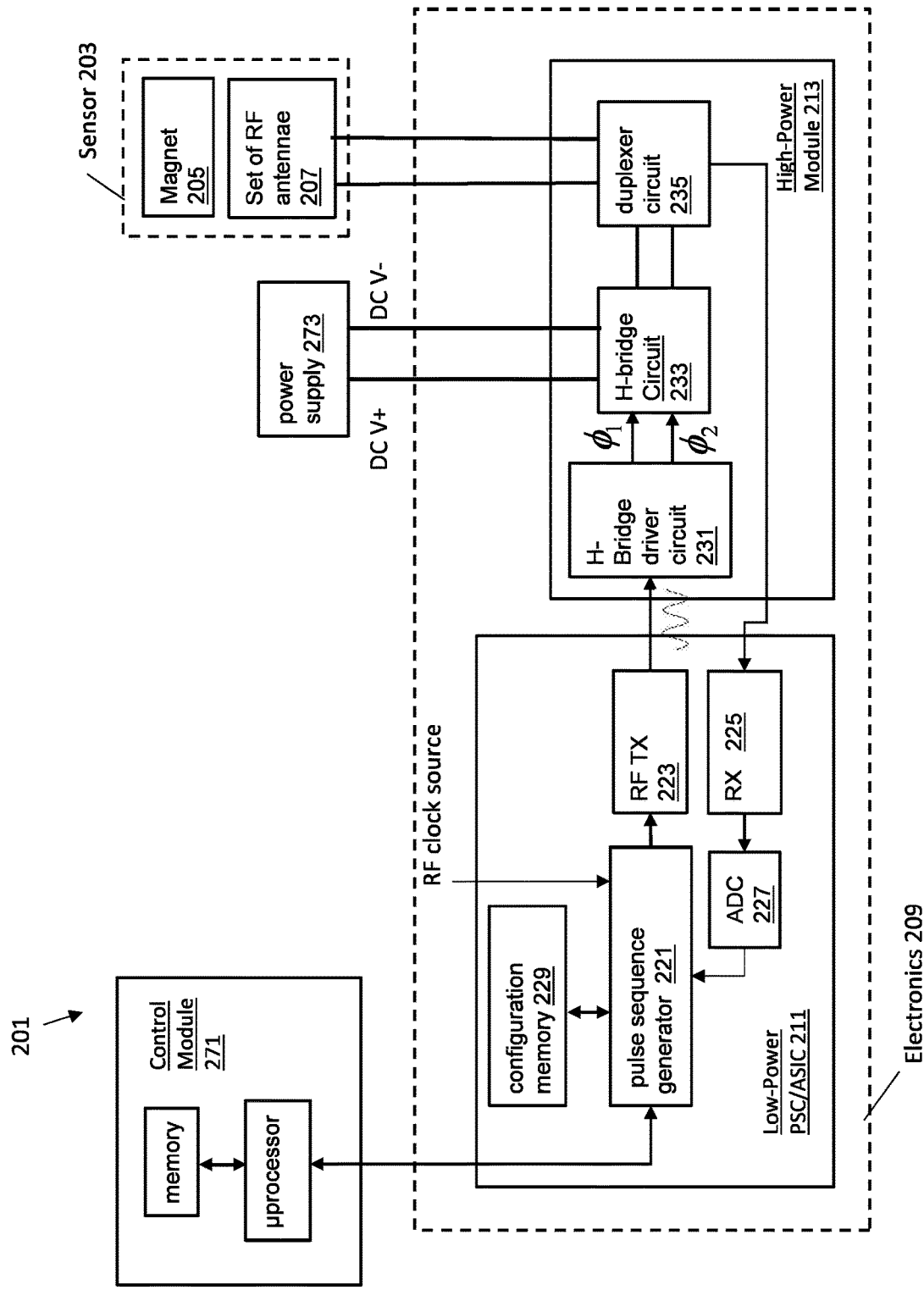
FIG. 2 is a schematic functional block diagram of components of an NMR logging tool and associated elements.

As shown in FIG. 2, an NMR logging tool 201 includes a sensor 203 that includes at least one permanent magnet 205 and set of RF antennae 207. The design of the sensor 203 is primarily determined by NMR spin physics. It requires that the magnet(s) 205 be a certain length to fully polarize proton spins at a given logging speed. For example, in one illustrative embodiment, the magnet(s) 205 can be about 36 inches long. In another illustrative embodiment, the magnet(s) 205 can be about 50 inches long. The set of RF antennae 207 can be custom-designed for the associated magnet(s) 205. For example, the set of RF antennae 207 can be about 6 inches long for an embodiment where the magnet(s) 205 is about 36 inches long. In another example, the set of RF antennae can be about 12 inches long for an embodiment where the magnet(s) 205 is 50 inches long. The length of the magnet(s) 205 is related to the specification of the formation signal, such as T1 and T2 of the formation fluids and the logging speed. In an embodiment, the design of the sensor 203 allows for space underneath the magnet 205, and some electronics or other components can then be housed in this space within the sensor 203, if desired.

Electronics

The NMR logging tool 201 also includes electronics 209 that includes a low-power Pulse Sequence Core (PSC) 211 and a high-power module 213.

Pulse Sequence Core (PSC)

The pulse-sequence core (PSC) 211 includes the core electronics of the NMR logging tool 201 and performs a variety of functions. For example, the PSC 211 can be configured to coordinate the operations of the NMR measurement and produce a series of pulses, delays, and many digital/analog signals to control many aspects of the NMR measurement (such as NMR signal acquisition, switching of RF gates and duplexer, Q-switching, etc.). For transmitting the RF pulses, the PSC can be configured to synthesize the RF pulses with precise timing, duration, RF phase, and RF amplitude. In embodiments, the PSC 211 can be embodied by an application-specific integrated circuit (ASIC), which is a single integrated circuit chip fabricated using commercially available process technology. The PSC/ASIC 211 can include a number of circuit components and features of the PSC 211 as listed below and shown in FIG. 2. These circuit components and features can be part of the single integrated circuit chip.

Pulse sequence generator 221. The pulse sequence generator 221 can be configured to synthesize essentially arbitrary pulse sequences, which include RF pulses with precise timing, duration, RF phase, and RF amplitude. It is desirable to expand the number of possible pulse sequences supported by the pulse sequence generator 221. The pulse sequence generator 221 can interface to an external control module 271. The control module 271, which can include memory and a microprocessor as shown, can be adapted to configure the NMR measurements controlled by the pulse sequence generator 221 by communicating parameters and possibly other control signals to the pulse sequence generator 221.

RF Transmitter (TX) 223. The RF TX 223 provides amplitude and phase control (such as 5-bit control for 32 different amplitudes and phases) for the RF pulses of the pulse sequences generated by the pulse sequence generator 221.

Receiver (RX) 225. The RX 225 is configured to demodulate the NMR signal supplied thereto (from the duplexer circuit of the high-power module 213) to provide two analog channels (I and Q) after demodulation.

Analog-to-Digital Converter (ADC) 227. The ADC 227 converts the analog I and Q channels output from the RX 225 into corresponding digital data in order to simplify signal detection. Alternatively or additionally, the analog I and Q channels output from the RX 225 can be supplied to an external analog-to-digital converter.

Configuration memory 229. Configuration memory 229 is on-chip memory that can be configured to store the values of certain parameters of the PSC/ASIC configuration, such as pulse sequence configuration data, receiver gain, receiver LO phase, tuning and matching condition, etc. These parameter values can be communicated from the control module 271 and stored in the configuration memory 229, or possibly stored in the configuration memory 229 when building or deploying the tool.

PFG circuit. The PFG circuit (not shown) generates digitally-programmable bipolar field gradient pulses that can be used for diffusion measurements. These pulses are generated by using an analog feedback loop to sense and control current flowing through an external gradient coil. Different gradient coils can be used to generate field gradients in different directions, such as the x, y, and z axes.

Output triggers. One or more output trigger signals (not shown) can be sent to external devices to either initiate the operation of the device or terminate its operation, or to initiate a pulse sequence of the device. These are typically digital signals, although analog outputs can also be used. Several output triggers can be combined to form a multi-bit signal. For example, to apply to a DAC (Digital-Analog Converter) to generate an analog voltage signal whose output voltage is fully controlled by the PSC/ASIC. This analog signal, for example, could be used to drive an external PFG unit (external to the one within the ASIC).

Input triggers. One or more input trigger signals (not shown) can be input from external devices into the PSC/ASIC 211. The input trigger signal(s) can be either digital or analog. The input trigger signal(s) can be read by the pulse sequence generator 221 and dictate the PSC/ASIC 211 to continue a pulse sequence, pause the sequence, or terminate the pulse sequence.

Master Clock input/output signal. The master clock signal (now shown) can be either part of the PSC/ASIC 211 or external. When the master clock is part of the PSC/ASIC 211, outputs are provided that allow synchronization of other units to this master clock signal. Alternatively, the master clock can be external. In this case, the PSC/ASIC 211 can accept an input signal from the external master clock which ensures synchronization of all the events.

A more detailed descriptions of the design and operation of these component circuits of the PSC/ASIC 211 is provided in co-owned United States Patent Publication No.: 2017-0248732, entitled "NMR ASIC", the contents of which are herein incorporated by reference in its entirety. To improve high-temperature operation of the system, the PSC/ASIC 211 can be implemented using silicon-on-insulator (SOI) process technology to reduce parasitic device capacitance, resulting in low leakage currents, high power efficiency and improved performance.

It is important to realize that PSC/ASIC 211 is the low-power part of the NMR well logging tool 201. For example, in embodiments, the power output of the RF pulse sequence output by the RF TX 223 can be in the range from 1-100 mW. This is sufficient to drive a small NMR coil, such as a micro-coil of a few millimeters in size. However, for well-logging applications, the sample volume is large and thus the RF power that is needed to drive the set of RF antennae 207 is quite high and can be in the range from a few hundred watts to a few kilowatts. For such applications, additional high-power transmitter circuitry is needed.

High-Power Module

The high-power module 213 of the tool 201 includes an RF amplifier that is configured to amplify the low-power RF signal of pulses produced by the RF TX 223 of the PSC/ASIC 211. For the well-logging NMR tool 201, the frequency of the low-power RF signal of pulses produced by the RF TX 223 is in the range from 0.1 to 3 MHz and a class-E amplifier can be used. In embodiments, the high-power module 213 of the tool 201 employs an H-bridge circuit driver circuit 231 and H-bridge circuit 233 that function as the RF amplifier of the high-power module as depicted in FIG. 2. The H-bridge circuit 233 includes four switches that enable voltage to be applied across a load in opposite directions. Thus, it can produce alternating current by operating the four switches.

Figure 3:
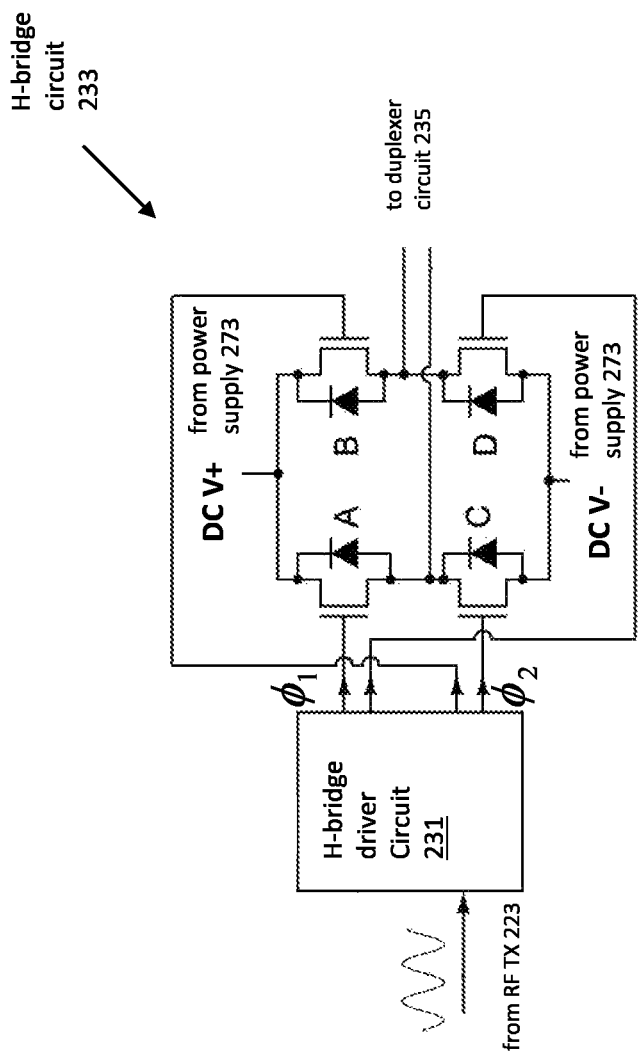
FIG. 3 is a schematic functional block diagram of an embodiment of the H-bridge circuit of FIG. 2.
Figure 4:
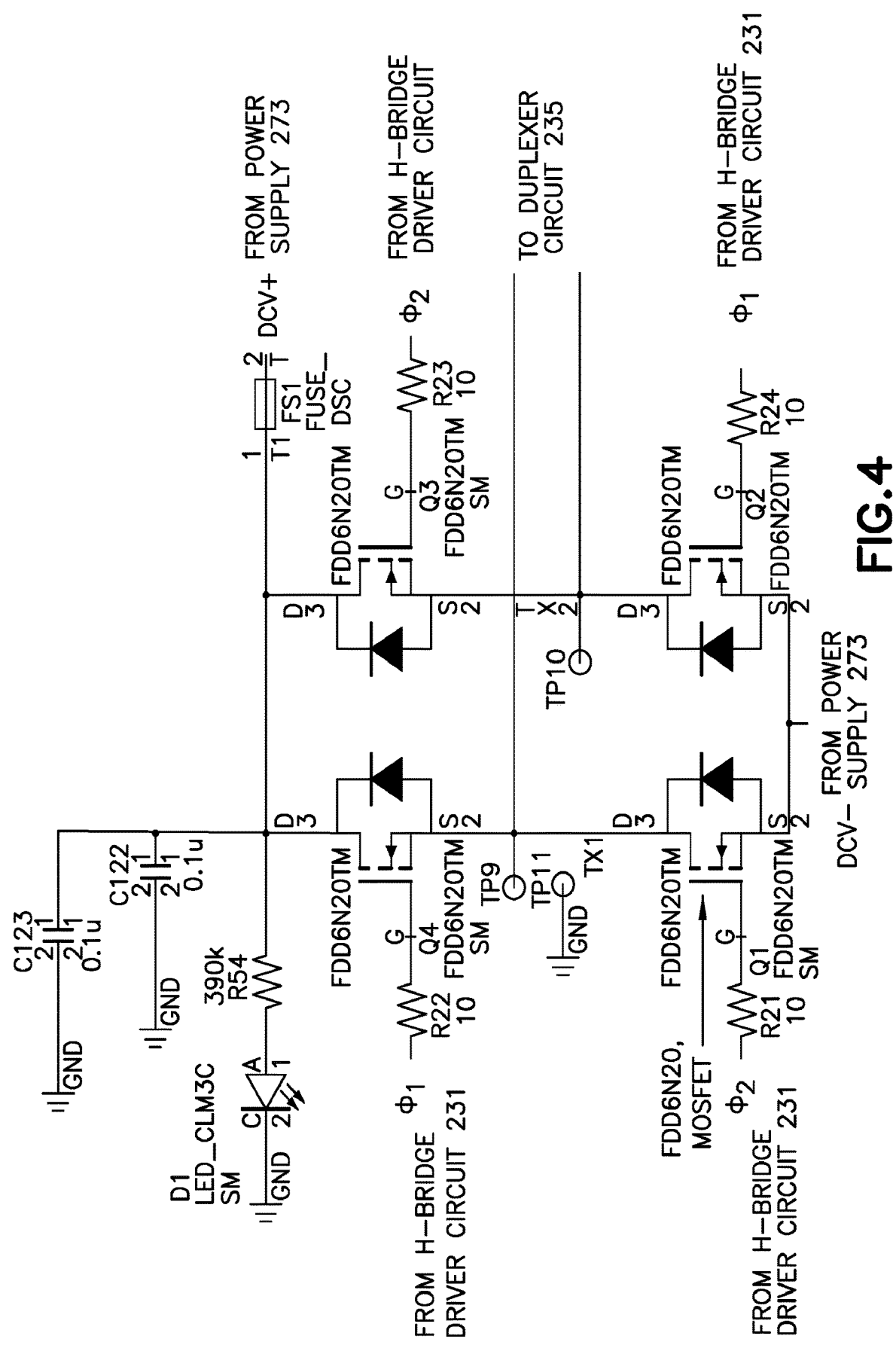
FIG. 4 is a schematic functional block diagram of another embodiment of the H-bridge circuit of FIG. 2.

Examples of the H-bridge circuit 233 are shown in FIGS. 3 and 4. In FIG. 3, four silicon-carbide (SiC) MOSFETs are used as four switches. In FIG. 4, four n-channel enhancement mode power field effect transistors (FDD6N20) commercially available from Fairchild Semiconductor Corp. of South Portland, Me. are used as four switches. In both embodiments, the H-bridge driver circuit 231 is configured to produce the two drive signals $\phi_1$, $\phi_2$ that are supplied to the gates of the four switches as shown. The drive signals $\phi_1$, $\phi_2$ are at the corresponding Larmor frequency, e.g. 2 MHz.

Figure 5A:
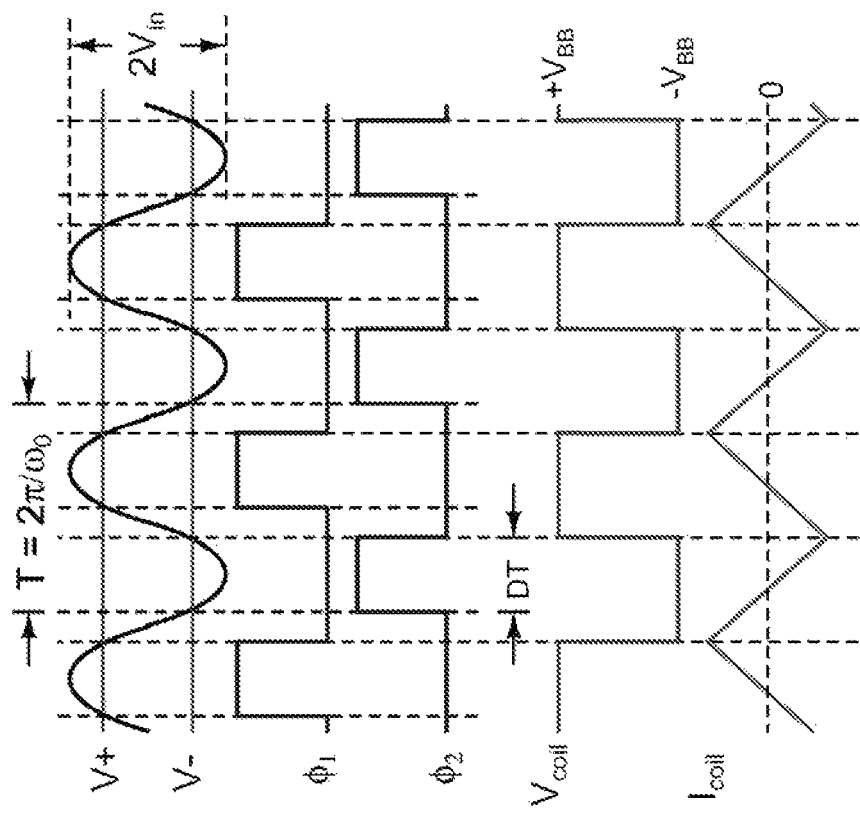
FIG. 5A includes plots of waveforms that illustrate the operation of the H-bridge circuits of FIGS. 3 and 4 and the associated H-bridge driver circuitry.

In the embodiments of FIGS. 2 and 4, the four switches are controlled by the two non-overlapping digital signals $\phi_1$, $\phi_2$ as shown in FIG. 5A. The signals $\phi_1$, $\phi_2$ are produced by the H-bridge circuit driver circuit 231 by comparing the low-power sinusoidal waveforms (of amplitude Vin) as produced by the RF TX 223 of the PSC/ASIC 211 with two reference voltages $V_+$ and $V_-$ (where $V_-=-V_+$). The signals $\phi_1$, $\phi_2$ alternately drive the two sets of switches such that the high-voltage source DC $V_+$ is connected with alternating polarity across the set of RF antennae to create an oscillatory current in the set of RF antennae. A load resistor (not shown) can be used in series with the high-voltage source DC $V_+$ in order to limit the current into the MOSFETs. In embodiments, the H-bridge circuit driver circuit 231 can include the IRS2011 integrated circuit commercially available from Infineon Technologies AG.

The duty cycle of digital signals $\phi_1$, $\phi_2$ is defined as the fraction of time these waveforms are active (at a logical value of 1) during an RF pulse. It is given by $$D = \frac{1}{2} \frac{\sin^{-1}(V_{+/-} - V_{in})}{\pi}. \qquad \text{Eqn. (7)}$$

Any power MOSFET is also associated with a parallel body diode that is intrinsic to the structure of the device. The combined device acts as an active switch (controlled by the gate voltage) for forward currents, which flow from the drain terminal to the source terminal through the MOSFET. It also acts as a passive switch (controlled by the drain-source voltage) for reverse currents, which flow from the source terminal to the drain terminal through the corresponding diode.

Figure 5B:
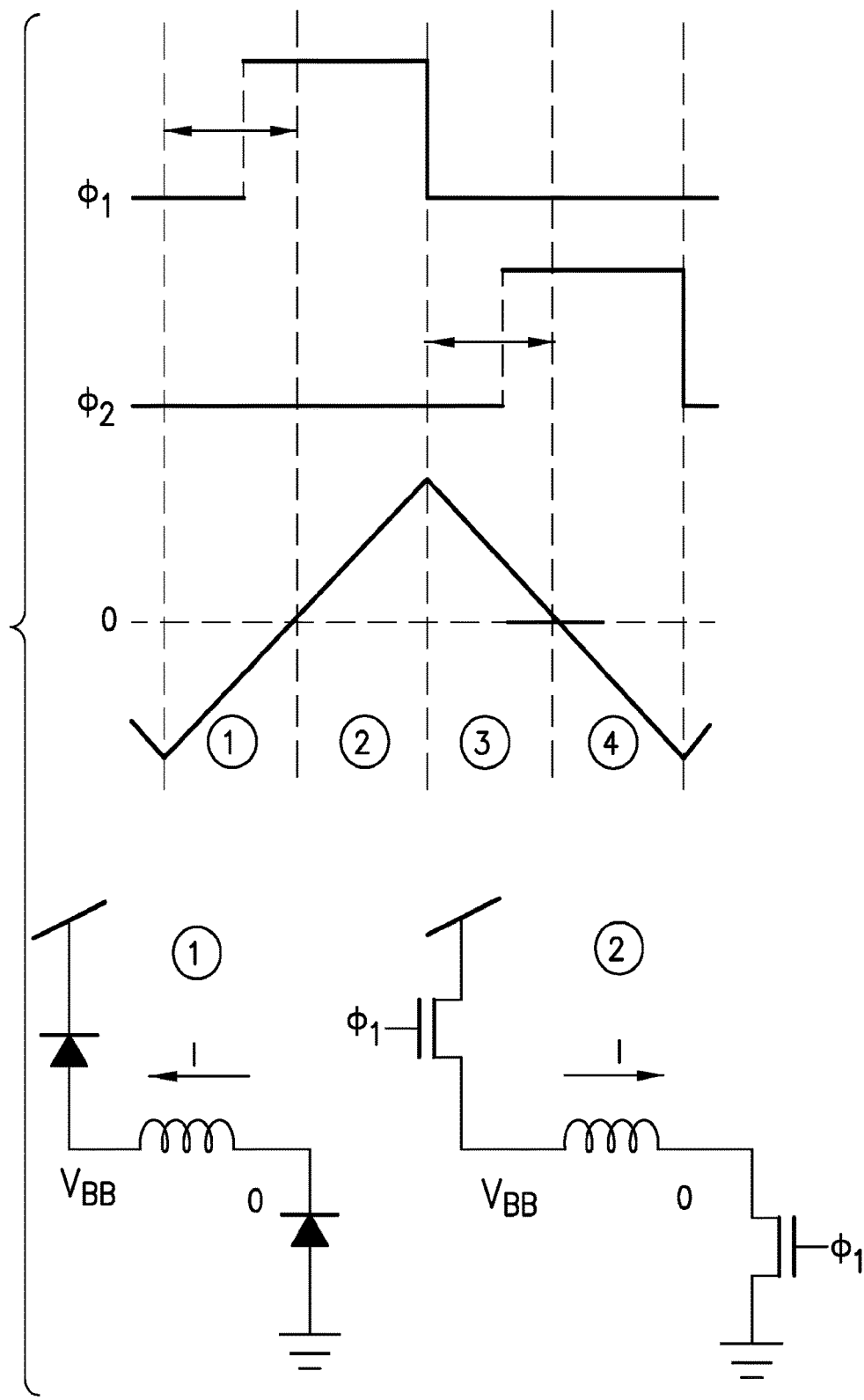
FIG. 5B includes plots and schematic diagrams of two circuit configuration states (state 1, state 2) for the continuous conduction mode of operation of the H-bridge circuits of FIGS. 3 and 4.
Figure 5C:
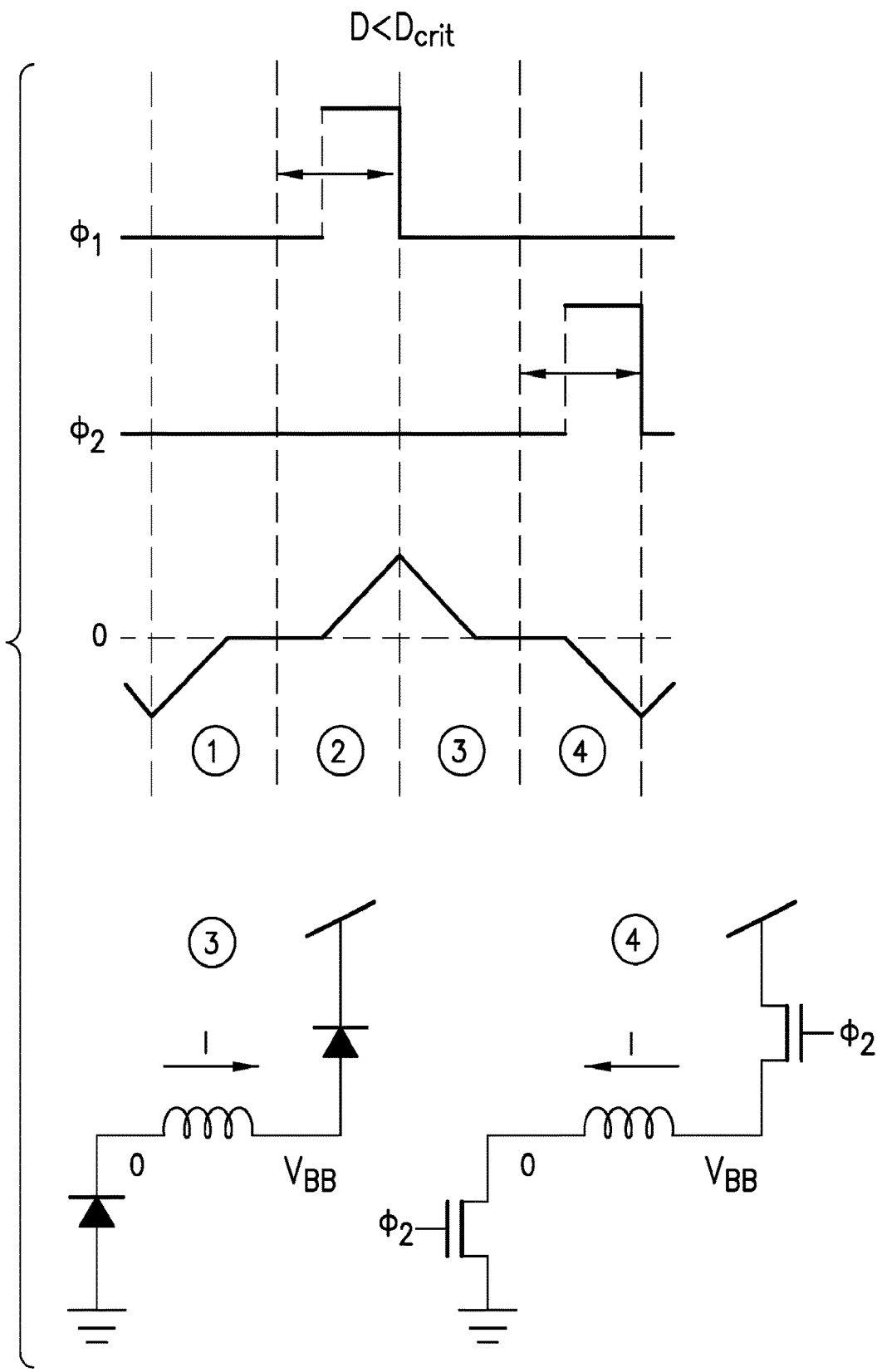
FIG. 5C includes plots and schematic diagrams for two circuit configuration states (states 3 and 4) for the discontinuous conduction mode of operation of the H-bridge circuits of FIGS. 3 and 4.

The H-bridge circuit 233 can operate in two distinct modes. The continuous conduction mode (CCM) is shown in FIG. 5B. It occurs when $D \geq D_{crit}$, where $D_{crit}$ is known as the critical duty cycle. The discontinuous conduction mode (DCM) is shown in FIG. 5C. It occurs when $D < D_{crit}$ and is characterized by a period when the current in the set of RF antennae is zero. FIGS. 5B and 5C shows the four possible states of conduction of the H-bridge circuit 233 (labeled 1-4). The key to understanding these states is to remember that the current in the set of RF antennae 207 cannot change suddenly, i.e., must remain continuous. In state 1, current is being carried by two of the body diodes. This state continues until the current reverses direction and the diodes switch off. The two MOSFET switches controlled by phase $\phi_1$ then start carrying the coil current, resulting in state 2. Once phase $\phi_1$ turns off, the current in the set of RF antennae 207 continues to flow through the two remaining body diodes (state 3) until it reverses direction. At this point it begins to flow through the two MOSFET switches controlled by phase $\phi_2$ (state 4). Eventually the $\phi_2$ signal turns off, the circuit returns to state 1 and the cycle continues.

The high-power module 213 of the tool 201 can also include a duplexer circuit 235 that is coupled between both the RF amplifier (e.g., H-bridge circuit 233) of the high-power module 231 and the receiver circuitry (RX 225) and the set of RF antennae 207 as shown in FIG. 2. The duplexer circuit 235 is configured to isolate the receiver circuitry (RX 225) from the RF amplifier (e.g., H-bridge circuit 233) and the set of RF antennae 207 during the transmission of RF pulses via the RF amplifier (e.g., H-bridge circuit 233) and the set of RF antennae 207. The duplexer circuit 235 is also configured to isolate the RF amplifier (e.g., H-bridge circuit 233) from the receiver circuitry (RX 225) and the set of RF antennae 207 during the reception of the NMR signal via the set of RF antennae 207 and the receiver circuitry (RX 225).

Figure 6:
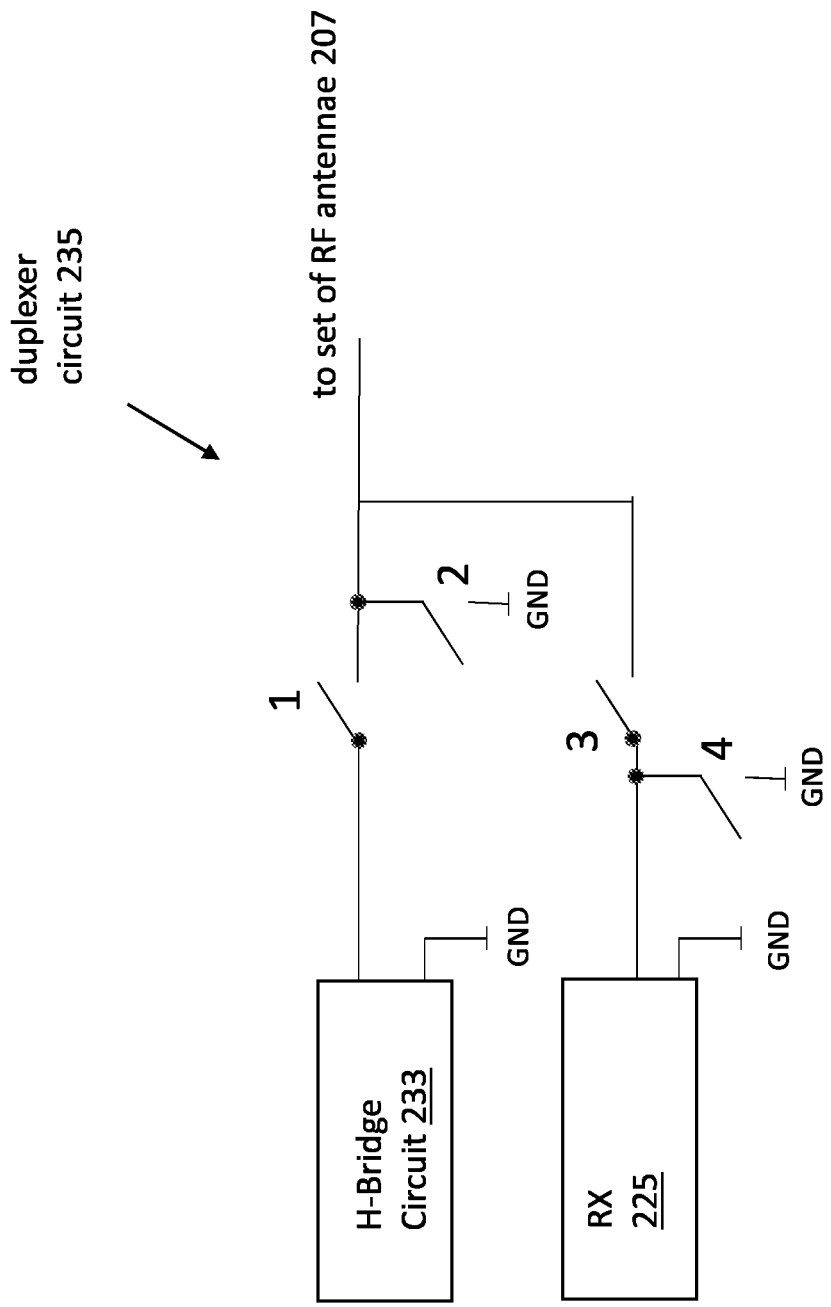
FIG. 6 is a schematic functional block diagram of an embodiment of the duplexer circuit of FIG. 2.

FIG. 6 illustrates an embodiment of the duplexer circuit 235, which employs four switches (labeled 1, 2, 3, 4) that are controlled by control signals supplied by the pulse sequence generator 221. During the transmission of RF pulses via the RF amplifier (e.g., H-bridge circuit 233) and the set of RF antennae 207, switches 1 and 4 are closed (connected) and switches 2 and 3 are open. This configuration isolates the receiver circuitry (RX 225) from the RF amplifier (e.g., H-bridge circuit 233) and the set of RF antennae 207 and protects the receiver circuitry (RX 225). Once the transmission of RF pulses is complete, switch 2 is closed momentarily in order to drain the energy in the set of RF antennae 207. This switch (and often with resistors, etc.) is often called a Q-switch. During the reception of the NMR signal via the set of RF antennae 207 and the receiver circuitry (RX 225), switches 1, 2 and 4 are open and switch 3 is closed. This configuration isolates the RF amplifier (e.g., H-bridge circuit 233) from the receiver circuitry (RX 225) and the set of RF antennae 207. The four switches of the circuit can be implemented by FET devices or other suitable protection devices.

Figure 7:
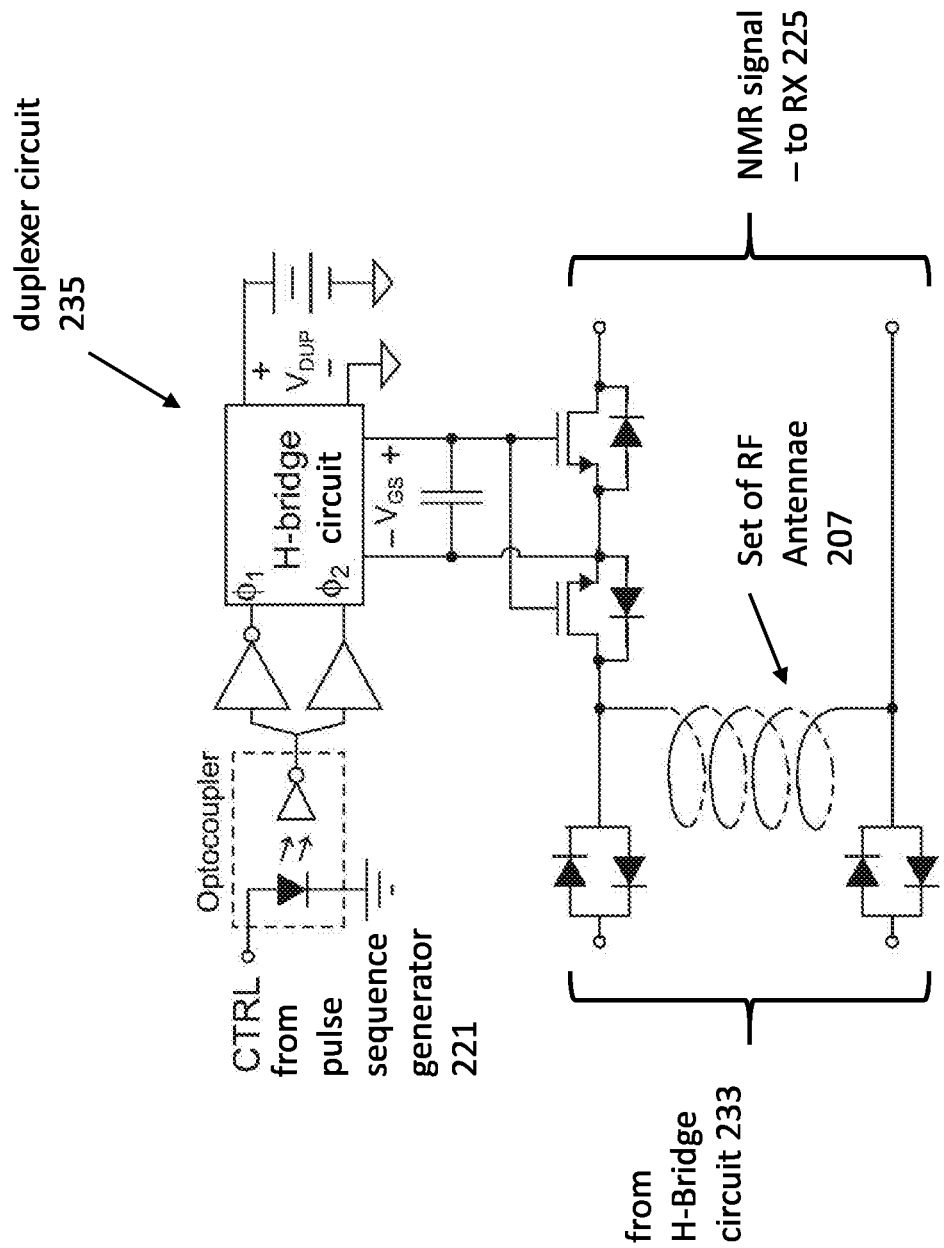
FIG. 7 is a schematic functional block diagram of another embodiment of the duplexer circuit of FIG. 2.

FIG. 7 illustrates another embodiment of the duplexer circuit 235, which includes two FET switches that are connected back-to-back and controlled by a control signal CRTL supplied by the pulse sequence generator to isolate and protect the receiver circuitry (RX 225) from the H-bridge circuit 233 during the transmission of RF pulses (i.e., when the transmitter is ON). A pair of cross-coupled diodes is also provided to isolate the H-bridge circuit 233 from the set of RF antennae 207 during the reception of the NMR signal by the receiver circuitry (RX 225) (i.e., when the transmitter is OFF). Each one of the two FET switches can only block positive rain-source voltages, because the intrinsic or body diode turns on when the voltage becomes negative. Thus, two back-to-back FET switches are needed to block the transmitter voltage, which is bidirectional in nature. In addition, the switching action of each FET switch is controlled by a control voltage $V_{GS}$ applied between the gate and source terminals of the respective FET switch. The control voltage is independent of the actual voltage on these terminals with respect to ground. As a result, the driver circuitry that generates the control voltages $V_{GS}$ for the two FET switches must be isolated from the rest of the electronics. Magnetic isolation using a transformer is only effective for AC signals, and is thus limited to short acquisition times. Thus, the circuit employs an optocoupler for optical isolation to avoid this problem. The output of the optocoupler is powered by a floating battery voltage $V_{DUP}$ that is supplied to an H-bridge circuit that sets the gate-source control voltages for the two FET switches to $+V_{DUP}$ or $-V_{DUP}$ during the transmitter ON and OFF states, respectively, under control of the control signal CRTL.

Note that the direct-current power supply signals (DC $V_+$ and DC $V_-$) play a role in the final output of the H-bridge circuit 233. For example, if the on-resistance of the switches is ignored, the current provided to the set of RF antennae 207 is $$I_c \propto \frac{(V_+ - V_-)}{Z_f}, \qquad \text{Eqn. (8)}$$

where $Z_f$ is the impedance of the tank circuit at the operating frequency f. As a result, high current and power can be achieved by raising the supply voltages. The DC power supply 273 for the H-bridge circuit can be installed near or at a distance from the H-bridge circuit 233.

Although high voltage, high power MOSFET transistors are available on the market as a single component, a MOSFET built on an integrated circuit (IC) is often limited in its voltage/power specification. For example, some silicon processes allow a bias voltage of up to 5-10 V only. Such a chip will have very limited power output. See Ha, D., Paulsen, J. L., Sun, N., Song, Y.-Q., & Ham, D. (2014), "Scalable NMR spectroscopy with semiconductor chips", *Proceedings of the National Academy of Sciences,* 111(33), 11955-11960.

Other process technologies may allow higher voltage, such as 50 V and 90V. As a result, significantly more power can be delivered from high power MOSFET transistors made with such process technologies. For example, a supply voltage of 50V may provide 1A with a 50 ohms load, an improvement when compared to 5V output. However, such a chip may still not provide sufficient power for a logging tool. For example, in one embodiment, the RF antenna of the logging tool can be about 6 inches long and is typically powered by an RF pulse with an amplitude of approximately 200V (rms).

It is also worth considering hybrid chips can possibly be used to implement the switching transistors of the H-bridge circuit 233. For example, hybrid chips that combine an epitaxially-grown wide bandgap (WBG) substrate (such a GaN-on-Si epitaxial layer) onto a conventional silicon wafer can possibly be used where the WBG layer is suitable for the high-power amplification stage.

In addition, system miniaturization can possibly be achieved by combining bare dies of transistors in an MCM (multi-chip module), or tightly packaging transistors on PCBs.

Figure 8B:
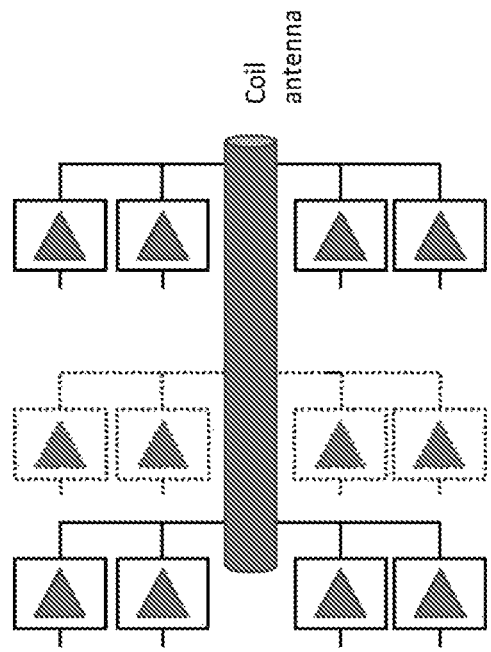
FIG. 8B is a schematic functional block diagram of another power amplification circuit in accordance with an embodiment of the present disclosure.
Figure 8A:
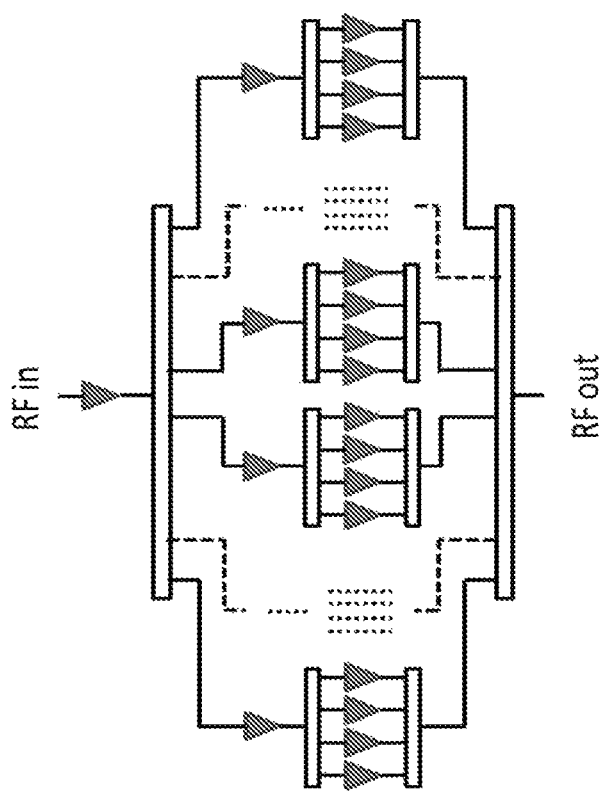
FIG. 8A is a schematic functional block diagram of a power amplification circuit in accordance with an embodiment of the present disclosure.
Figure 9:
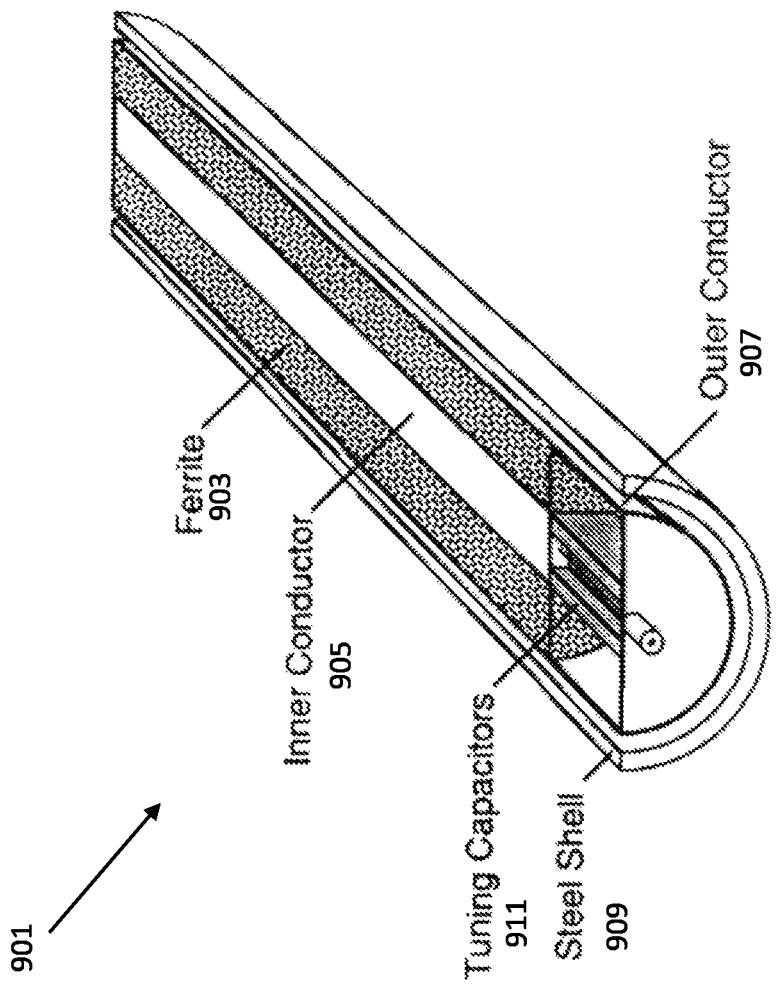
FIG. 9 is a schematic block diagram of an RF antenna of a prior art NMR logging tool.

Another approach is to combine power outputs of multiple lower-power IC's or MCM modules. The power combination/adding can be done on a PCB trace (FIG. 8A), while still providing the necessary phase control for individual contributions. It is also possible to add power outputs of multiple components by connecting at different points directly on an RF coil antenna (FIG. 8B). Some of these schemes have been disclosed in co-owned U.S. Pat. No. 9,392,681, the content of which is herein incorporated by reference in its entirety. RF antenna array FIG. 9 depicts an RF antenna 901 of an NMR well logging tool where the RF antenna 901 is about 6 inches in length. In this embodiment, a ferrite core 903 occupies the semi-annular space between an inner conductor 905 and a semi-cylindrical outer conductor 907. A semi-cylindrical steel shell 909 covers the outer conductor 907 and supports the assembly. Tuning capacitors 911 can also be provided in order to adjust the frequency of the electrical resonance of the RF antenna circuit as desired. The inductance of the RF antenna is approximately 0.15 uH, and impedance at 2 MHz is about 2.5 ohm. Thus, the electrical current in the RF antenna during an RF pulse of 200 V is approximately $$I_c \propto \frac{200\ V}{2.5\ \Omega} \sim 80A. \qquad \text{Eqn. (9)}$$

If the 6-inch RF antenna 901 is split into 4 sections, each section is about 1.5 inches long. In this case, the inductance of each RF antenna section will be approximately a quarter (¼) of the original 6-inch RF antenna, ~0.05 uH. As a result, a 50V (a quarter of the 200V) RF pulse applied to one section of the RF antenna will produce the same amount of current in that one section (e.g., ~80 Å) as compared to the current that results from 200V RF pulse applied to the 6-inch RF antenna. Thus, four high-power RF amplifier stages (four H-bridge circuits 233) that each produce a 50V pulse can be configured to drive different quarter sections of the RF antenna and produce the same amount of current in the RF antenna and thus the same B1 field as that from an RF pulse of 200 V. In this manner, the relatively long RF antenna 901 can be substituted by an array of relatively shorter RF antennae.

An important concern when an array of relatively shorter RF antennae is used instead of a single relatively larger RF antenna is the mutual coupling between the RF antennae of the array. A relevant figure of merit for characterization of such mutual coupling is (L/MQ), where L is the self-inductance, M is the mutual inductance and Q is the antenna quality factor. This figure of merit should be kept as large as possible (>10). As the length of an RF antenna is reduced, the inductance and resistance approximately scales with the length. As a result, the ratio (L/Q) gets smaller with shorter antenna lengths. On the other hand, the mutual inductance between Rf antennae is relatively constant with length. Assuming a Q of 10, the figure of merit L/MQ for two 6-inch-long RF antennae is 10. However, this figure of merit reduces to 3 for two 1.5-inch-long RF antennae.

Figure 10A:
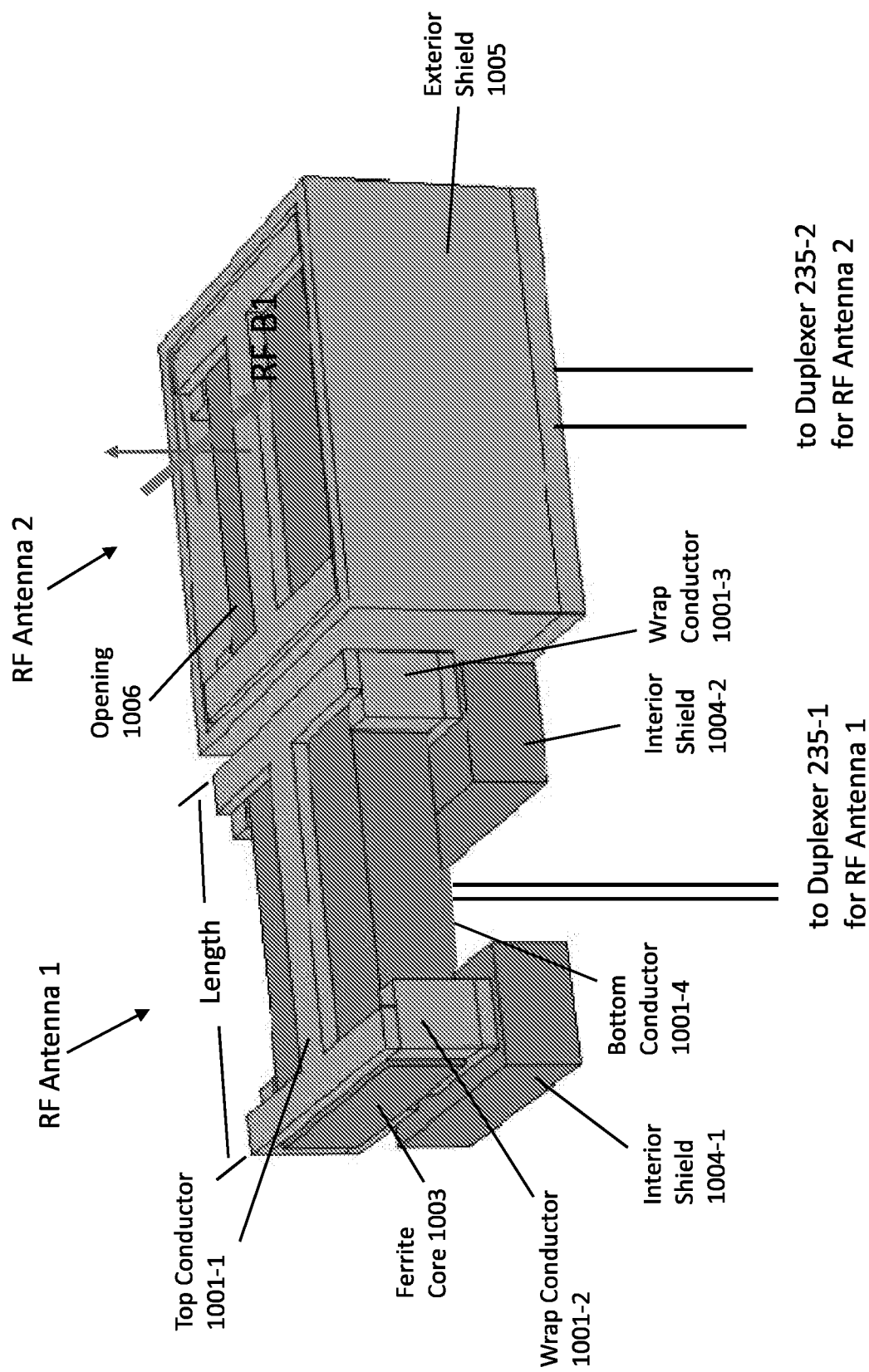
FIGS. 10A, 10B and 10C are schematic views of an array of RF antenna elements.
Figure 10B:
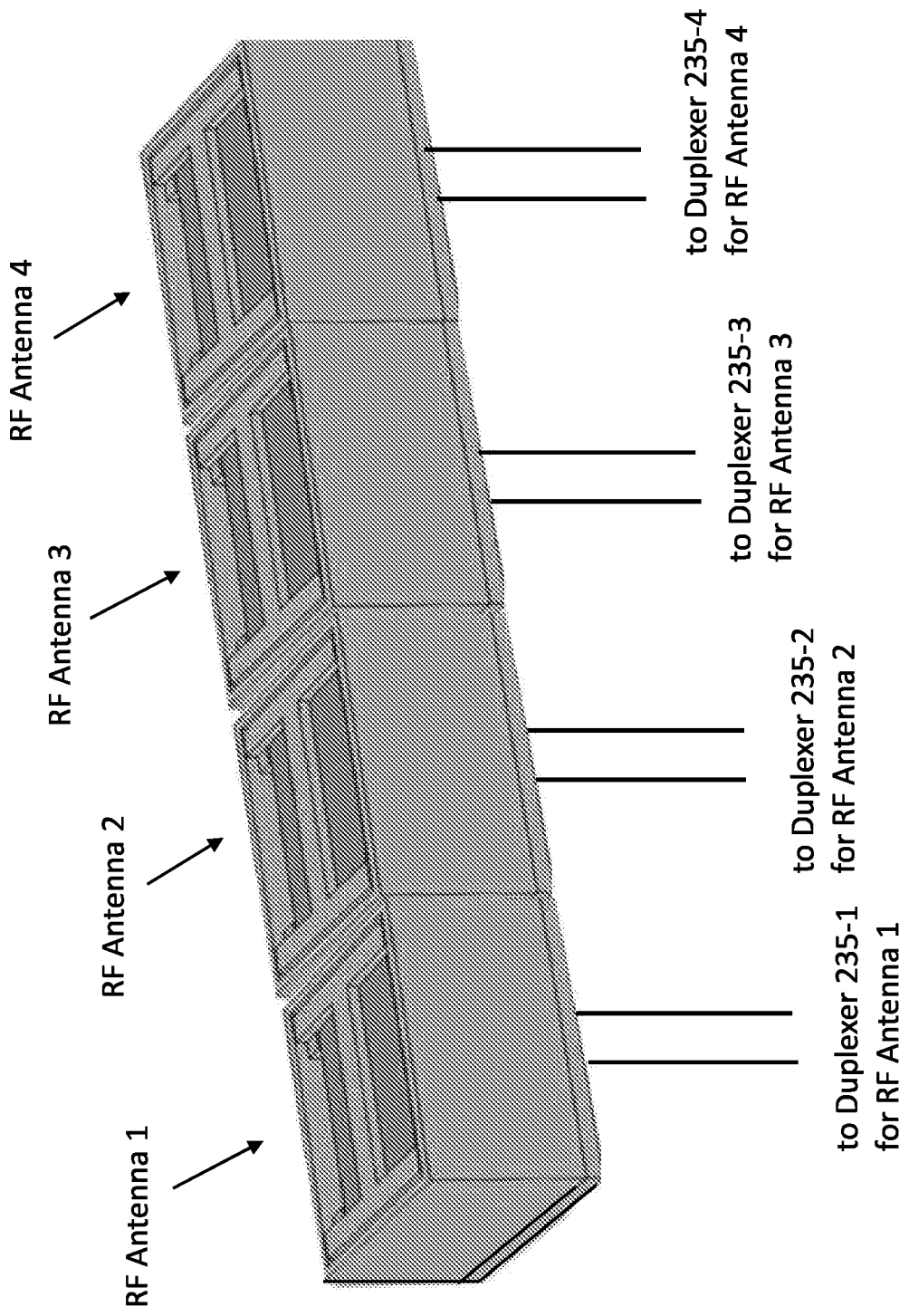
Figure 10C:
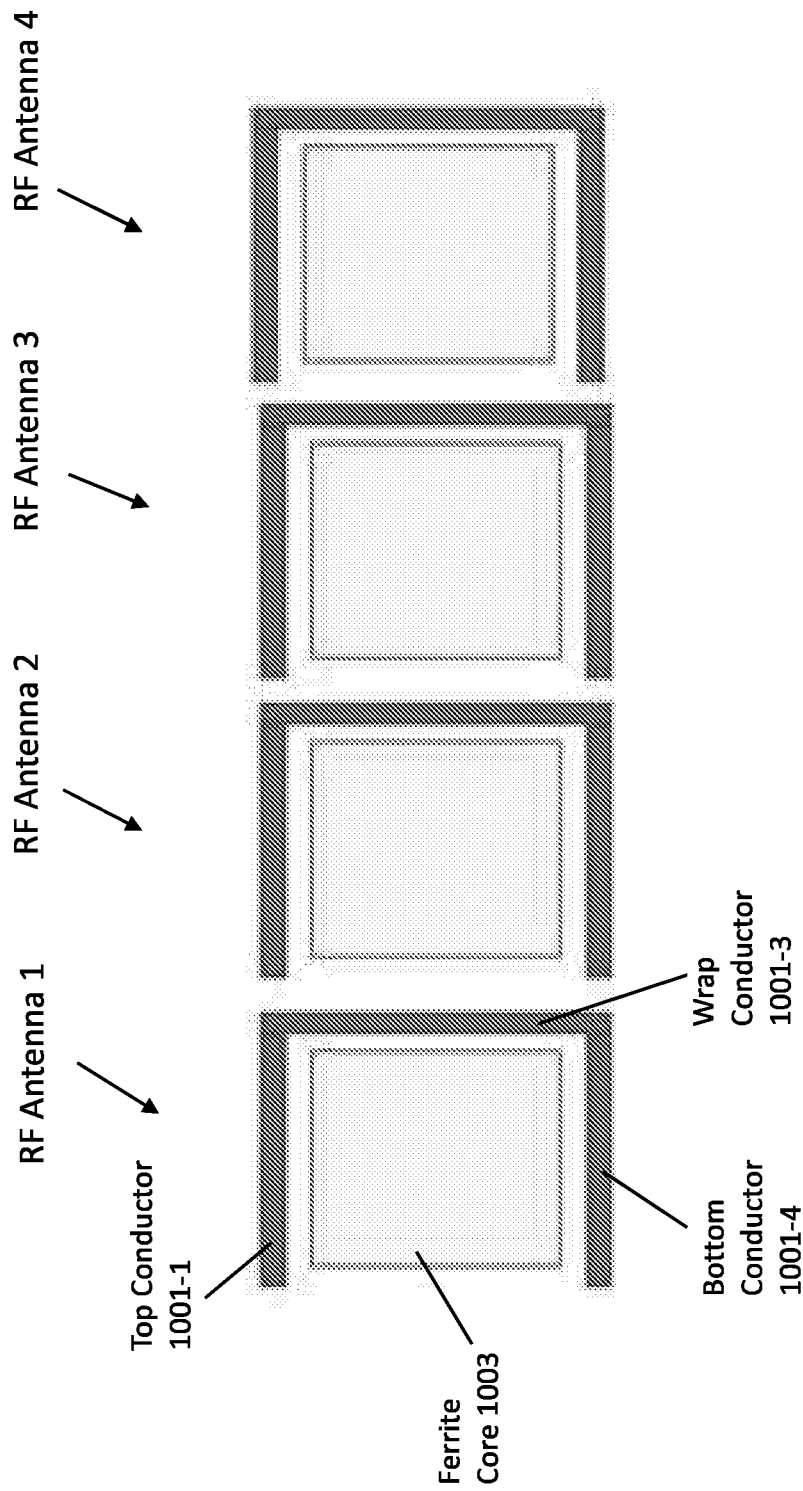

In embodiments, an RF antenna design shown in FIGS. 10A, 10B and 10C can be used to implement an array of RF antennae (or antenna elements). FIG. 10A illustrates two RF antenna elements (labeled "RF Antenna 1" and "RF Antenna 2"). FIG. 10B illustrates an array of four RF antenna elements (labeled "RF Antenna 1" and "RF Antenna 2" and "RF Antenna 3" and "RF Antenna 4"). FIG. 10C is a partial cross-sectional view through the interior components of the array of RF antennae shown in FIG. 10B. The four RF antenna elements of the array are electrically coupled to corresponding high-power modules where each high-power module includes an H-bridge driver circuit 231, an H-bridge circuit 233 and a duplexer circuit 235 as shown in FIG. 2. It is contemplated that one or more high power modules can be miniaturized into an integrated circuit chip.

In FIG. 10A, the schematic view of RF Antenna 1 shows the inside of the RF antenna element (while omitting the exterior shield), while the schematic view of RF Antenna 2 shows the exterior shield and thus hides the details of the interior components. Here, each RF antenna element of the array includes an elongate ferrite core 1003 which can be in a block form as shown. The ferrite core 1003 is surrounded by a number of conductors 1001 that are interconnected to one another. Such conductors 1001 include an elongate (strip) top conductor 1001-1 that extends along the length dimension of the top side of the ferrite core 1003 (which corresponds to the top side of the RF antenna element, a first wrap conductor 1001-2 that wraps around one end of the of the ferrite core 1003, a second wrap conductor 1001-2 that wraps around the other end of the ferrite core 1003 opposite the first wrap conductor 1001-2 along the length dimension of the ferrite core 1003, and an elongate (strip) bottom conductor 1001-4 that extends along the length dimension of the bottom side of the ferrite core. Two interior shield blocks 1004-1, 1004-2 are disposed under the first and second wrap conductors 1001-2, 1001-3. The interior shield blocks 1004-1, 1004-2 can be formed from a ferrite core material, similar to the material for 1003. All sides of the RF antenna element, except for the top side, are covered by an exterior shield 1005. The exterior shield 1005 can be formed from a conducting material, such as copper, aluminum or other metals. In this manner, the exterior shield 1005 forms an opening 1006 for the top-conductor 1001-1. The conductor (e.g., sections 1001-1, 1000-2, 1001-3, 1001-4) of the respective RF antenna element can be electrically coupled to a corresponding duplexer circuit for the respective RF antenna element as shown in FIGS. 10A and 10B. Thus, the top conductor 1001-1 and the bottom conductor 1001-4 of RF Antenna 1 are electrically coupled to a corresponding duplexer circuit 235-1. The top conductor 1001-1 and the bottom conductor 1001-4 of RF Antenna 2 are electrically coupled to a corresponding duplexer circuit 235-2. The top conductor 1001-1 and the bottom conductor 1001-4 of RF Antenna 3 are electrically coupled to a corresponding duplexer circuit 235-3. And the top conductor 1001-1 and the bottom conductor 1001-4 of RF Antenna 4 are electrically coupled to a corresponding duplexer circuit 235-4.

On the top side of the respective RF antenna element, the elongate top conductor 1001-1 is exposed by the opening 1006 such that it can transmit the oscillating RF magnetic field $B_1$ into the space above the elongate top conductor 1001-1 for the RF pulses supplied to the RF antenna element via the corresponding duplexer circuit. The oscillating RF magnetic field $B_1$ is shown in FIG. 10A with respect to the RF antenna element labeled "RF Antenna 2". In embodiments, the oscillating RF magnetic field $B_1$ produced by the RF antenna element is transverse to both a direction normal to the elongate top conductor 1001-1 of the RF antenna element and a direction parallel to the longitudinal direction of the elongate top conductor 1001-1 of the RF antenna element. Note that the interior shield blocks 1004-1, 1004-2 of each RF antenna element are provided to shield the RF magnetic field emitted from the top side of the RF antenna element. In this configuration, the first and second wrap conductors 1001-2, 1001-3 are partially covered by the exterior shield 1005, and the bottom conductor 1001-4 and the two interior shield blocks 1004-1, 1004-2 are fully covered by the exterior shield 1005.

In embodiments, the four RF antenna elements of the array are separate and distinct from one another and each one can have a length dimension of 1.5 inches such that the total length of the four RF antenna elements of the array is about 6 inches. Furthermore, each one of the four RF antenna elements can have a figure of merit LM/Q greater than 10 even with the length of 1.5 inches. This design produces an RF field profile which is similar to the RF antenna of FIG. 9 and can be up to 50% more efficient depending on the width(s) of the four RF antenna elements of the array.

Note that the embodiment of FIGS. 10A, 10B and 10C employs a rectangular design for the RF antenna elements. Other coil designs are possible. For example, a one-turn coil can be used for the RF antenna elements. In another embodiment, a coil design with 2 turns can be used where the conductor wraps around the ferrite core 1003 twice. Furthermore, in other embodiments, the general shape or profile of each RF antenna can be a half circle cross-section in place of the rectangular cross-sectional shape of the design of FIGS. 10A, 10B and 10C. In such a design, the general shape or profile of most of the components (e.g. 1003, 1001, 1004) of the respective RF antenna elements can be modified to conform to the half circle cross-sectional profile. Furthermore, the respective RF antenna elements can be configured in various shapes that are necessary to accommodate the mechanical design of the sensor assembly.

NMR System Design

In embodiments, the electronics 209 of the NMR well logging tool can include several sub-modules each including a low-power PSC/ASIC 211 and a high-power module 213 as described above with respect to FIG. 2. The high-power module includes an H-bridge driver circuitry, H-bridge circuit and duplexer circuit as described herein and can be realized as an integrated package such as IC, MCM, or a miniaturized PCB. The high-power modules are connected to different RF antenna elements of the antenna array (FIGS. 10A, 10B and 10C). Each low-power PSC/ASIC 211 is configured to execute the pulse sequence and data acquisition. The NMR data from each RF antenna element will be acquired independently and can be stored by the control module 271 for processing. The processing can be carried out by the control module 271 (which is part of the logging tool), or the NMR data can be sent up to a surface computer to be processed.

Figure 11:
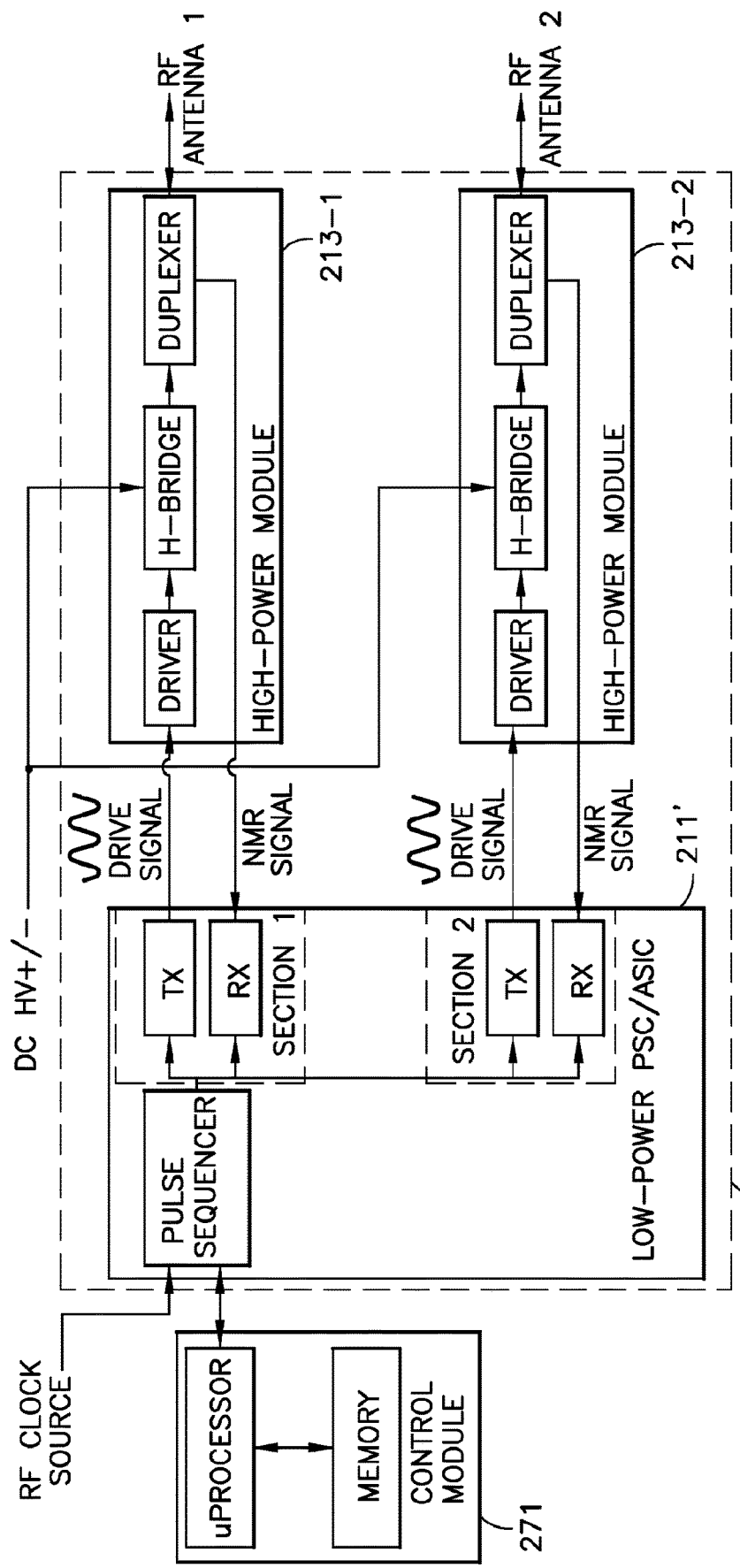
FIG. 11 is a schematic functional block diagram of an embodiment of the electronic circuitry of an NMR logging tool that employs an array of RF antenna elements, such as the array of RF antenna elements shown in FIGS. 10A, 10B and 10C.

In another embodiment shown in FIG. 11, the electronics 209 of the NMR logging tool can include a single low-power PSC/ASIC 211 that is connected to multiple high-power modules (two shown as 213-1, 213-2). The high-power modules are connected to different RF antenna elements of the antenna array (FIGS. 10A, 10B and 10C). In this case, the PSC/ASIC 211 can include separate and distinct RF TX and RX circuits (labeled Section 1 and 2) that correspond to the multiple high-power modules. These separate and distinct RF TX and RX circuits (labeled Section 1 and 2) are connected to the different high-power modules as shown. In this embodiment, the timing of the pulse sequence transmission and the NMR signal acquisition for the separate RF TX and RX circuits can be synchronized by the control signals supplied by the pulse sequence generator of the PSC/ASIC 211 to the separate and distinct RF TX and RX circuits. The NMR data from each RF antenna element will be acquired independently and can be stored by the control module 271 for processing. The processing can be carried out by the control module 271 (which is part of the logging tool), or the NMR data can be sent up to a surface computer to be processed.

Figure 12:
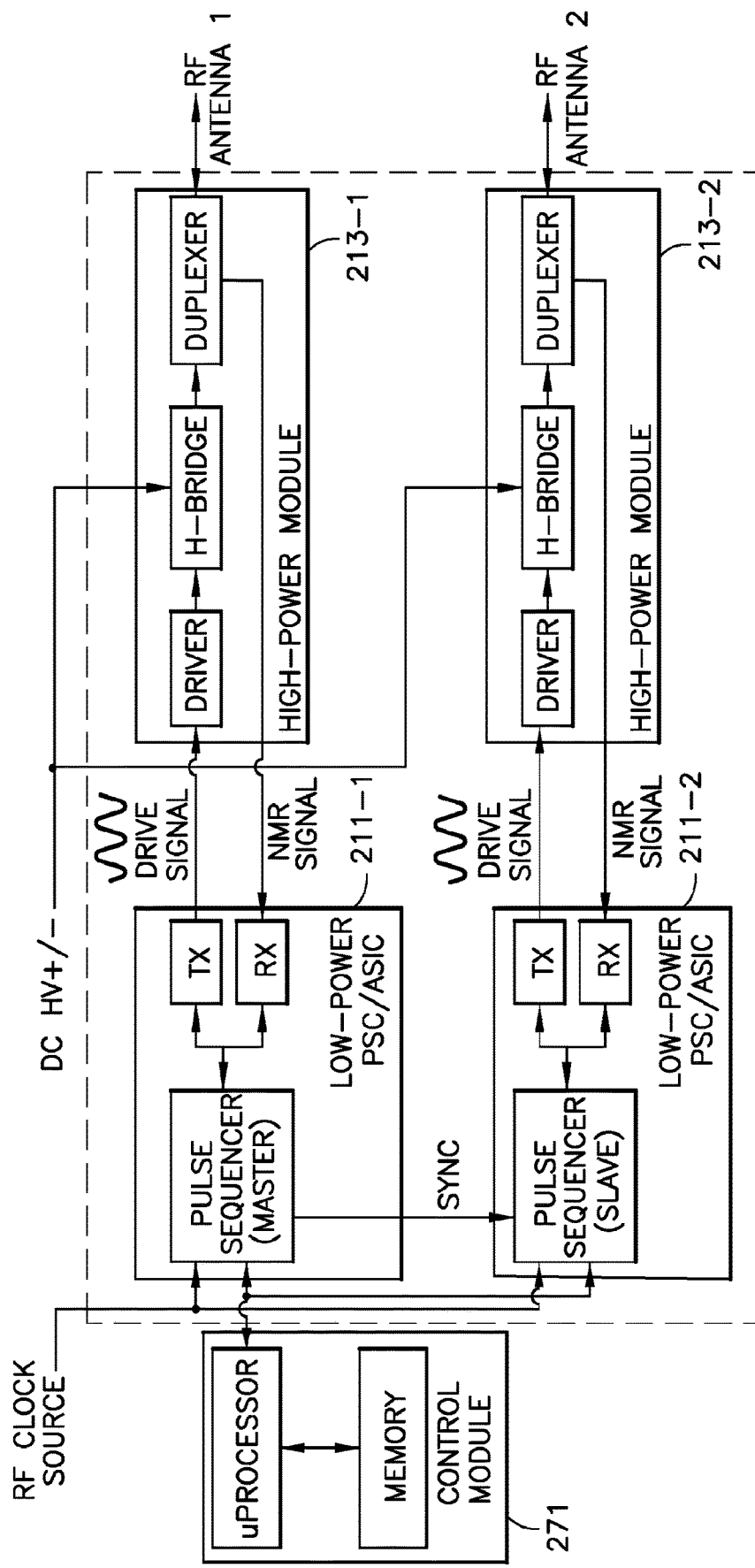
FIG. 12 is a schematic functional block diagram of another embodiment of the electronic circuitry of an NMR logging tool that employs an array of RF antenna elements, such as the array of RF antenna elements shown in FIGS. 10A, 10B and 10C.
Figure 13:
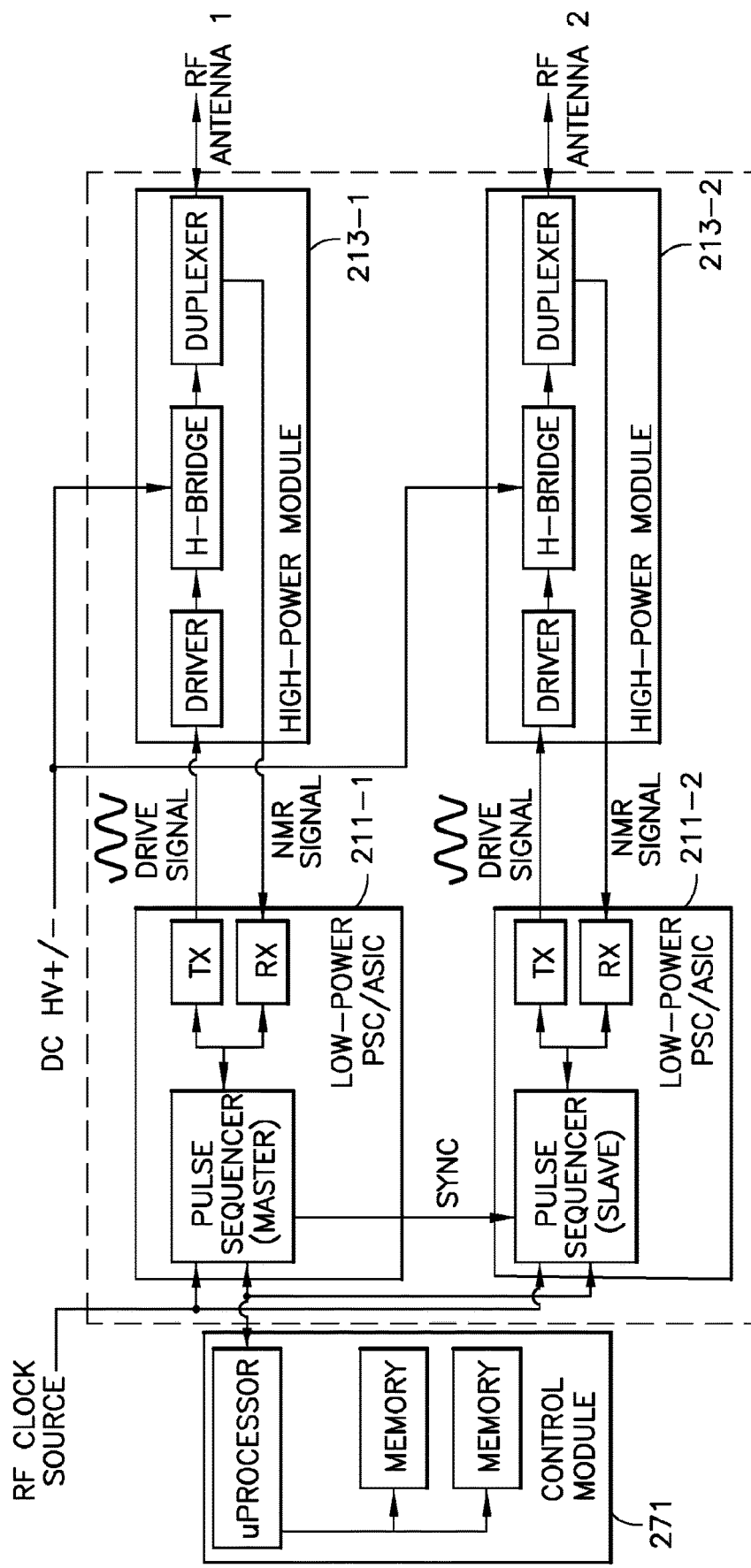
FIG. 13 is a schematic functional block diagram of yet another embodiment of the electronic circuitry of an NMIR logging tool that employs an array of RF antenna elements, such as the array of RF antenna elements shown in FIGS. 10A, 10B and 10C.

In yet other embodiments, the electronics 209 of the NMR logging tool can include multiple low-power PSC/ASICs (two shown as 211-1, 211-2) that are connected to multiple high-power modules (two shown as 213-1, 213-2) as shown in FIGS. 12 and 13. In these embodiments, the pulse sequence generators of the multiple low-power PSC/ASICs can be synchronized for the timing of the pulse sequence transmissions and NMR signal acquisition. For example, an RF clock can be provided from the same source, so that both the RF pulse phase and frequency are consistent between individual channels. The NMR data from multiple channels may be stored in a single memory as shown in FIG. 12, or in an array of memory modules as shown in FIG. 13. In the embodiment of FIG. 12, the system can be configured with a mechanism to keep track of data origin (i.e., channel number) for the NMR data stored in the memory. In the embodiment of FIG. 13, each memory module can be associated with a particular channel. The NMR data stored in the memory(ies) can be processed by the control module 271 (which is part of the logging tool), or the NMR data can be sent up to a surface computer to be processed.

In embodiments, the electronics 209 of the NMR well logging tool as described herein can be packaged into a cartridge or other module form such as IC, MCM, or a miniaturized PCB that is smaller than the electronics cartridge of existing NMR well logging tools. The reduced footprint of the electronics cartridge has several merits, including: 1) the shorter tool typically has lower capex; 2) there are boreholes that only allow small tools to be conveyed in; and 3) For multi-coil tools, it is impossible to simply multiplicate electronics section by the number of coils. The miniaturization and integration of electronics is a prerequisite of such tool development. Furthermore, it will make it easier to integrate a small NMR tool with other logging measurements.

Well Loggings System

Figure 14:
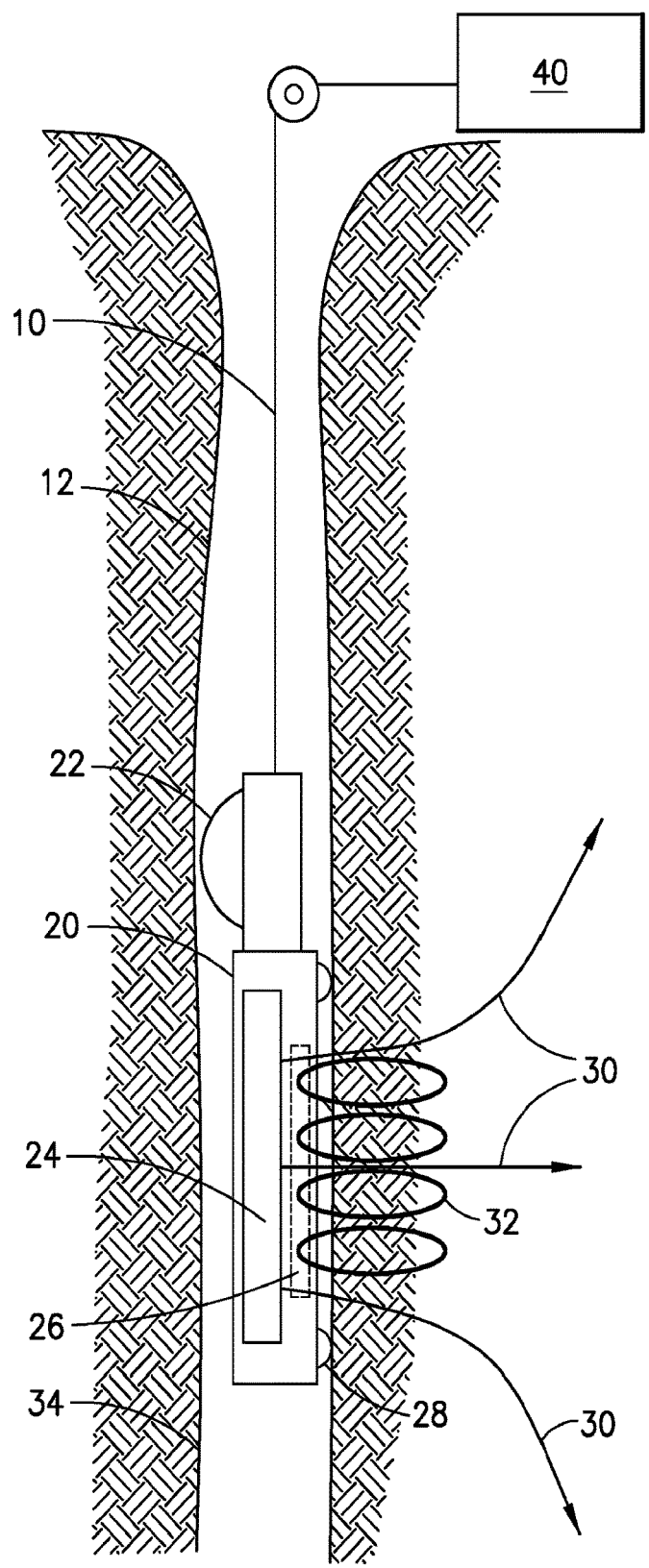
FIG. 14 is a schematic diagram of an NMR well logging system in accordance with one embodiment of the present disclosure.

FIG. 14 shows a well logging system that can be utilized for practicing embodiments of the present disclosure to investigate subsurface formations 34 traversed by a borehole 12. A magnetic resonance logging tool 20 is suspended in the borehole 12 on an armored cable 10, the length of which substantially determines the relative depth of the tool 20.

The length of cable 10 is controlled by suitable means at the surface such as a drum and winch mechanism. Surface equipment, represented as 40, can be of conventional type, and can include a processor subsystem that communicates with the downhole equipment, including the tool 20. It will be understood that some of the processing can be performed downhole and that, in some cases, some of the processing may be performed at a remote location.

The tool 20 also has mechanism 22 (such as a bowspring or retractable arm) that can be configured to press the body of the tool 20 against the borehole wall via standoff spacers 28 during logging. The spacers 28 and mechanism 22 help compensate for the rugosity of the borehole 12 while keeping the tool positioned closely to the side of the borehole under investigation. Although tool 20 shown in the embodiment of FIG. 16 has a single body, the tool 20 may obviously comprise separate components such as a cartridge, sonde or skid, and the tool 20 may be combinable with other logging tools as would be obvious to those skilled in the art. Similarly, although the wireline cable 10 is the form of physical support and communicating link shown in FIG. 16, alternatives are clearly possible, and the invention can be incorporated in a drill stem, for example, using forms of telemetry which may not require a wireline.

The tool 20 also includes a sensor that includes one or more magnets 24 and an array of RF antenna elements 26. The magnet(s) 24 generate a static magnetic field $B_0$ (depicted as arrows 30) having a static field direction substantially perpendicular (90°) to the longitudinal axis of the tool 20. Each RF antenna element of the array 26 generates an oscillating RF magnetic field $B_1$ (depicted as ovals 32) in the region under investigation (or sensitive zone) that is substantially perpendicular to both the longitudinal axis of the tool 20 and to the primary static field direction. It will be understood that the present invention may be applicable to other tool configurations.

The tool 20 also includes an electronics cartridge or electronics as described herein (not shown) that is operably coupled to the RF antenna elements of the array 26 and configured to cooperate with the antenna elements of the array 26 to make a measurement in the region of investigation (sensitive zone). Such measurements involve magnetically reorienting the nuclear spins of particles in the formation 34 with pulses of the oscillating magnetic field $B_1$ transmitted by the RF antenna elements of the array 26 and then detecting the NMR signals received by the RF antenna elements of the array 26 which result from the precession of the tipped particles in the static magnetic field $B_0$ within the region of investigation over a period of time. Embodiments of the electronics cartridge or electronics is described above with respect to FIGS. 2, 11, 12 and 13.

Figure 15A:
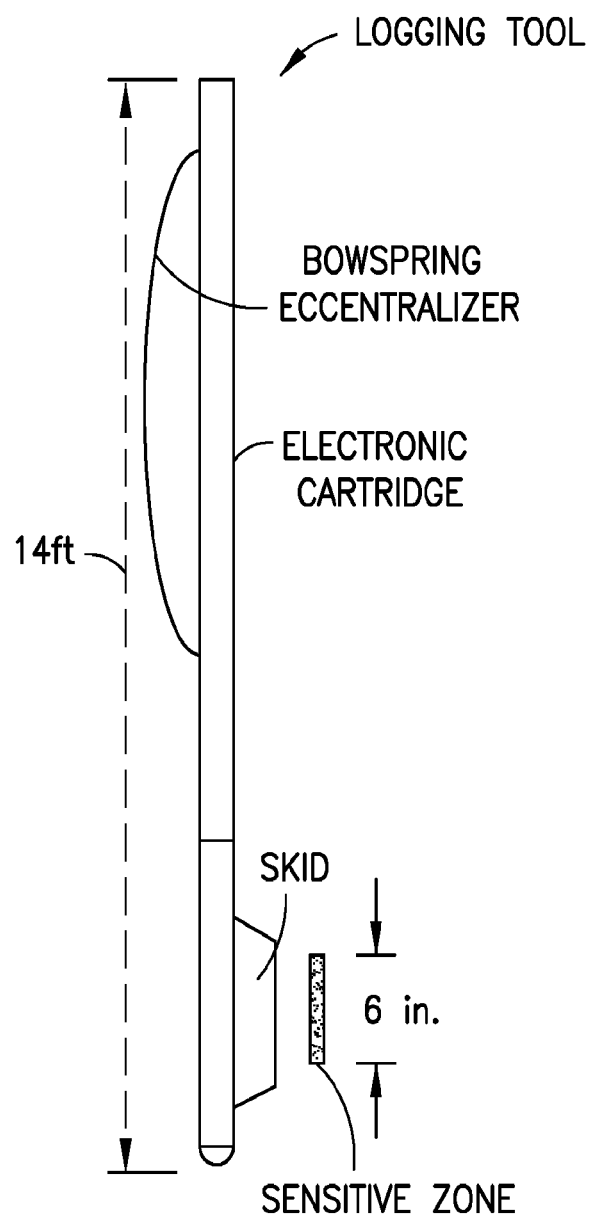
FIGS. 15A and 15B are schematic diagrams of an NMIR logging tool in accordance with one embodiment of the present disclosure.
Figure 15B:
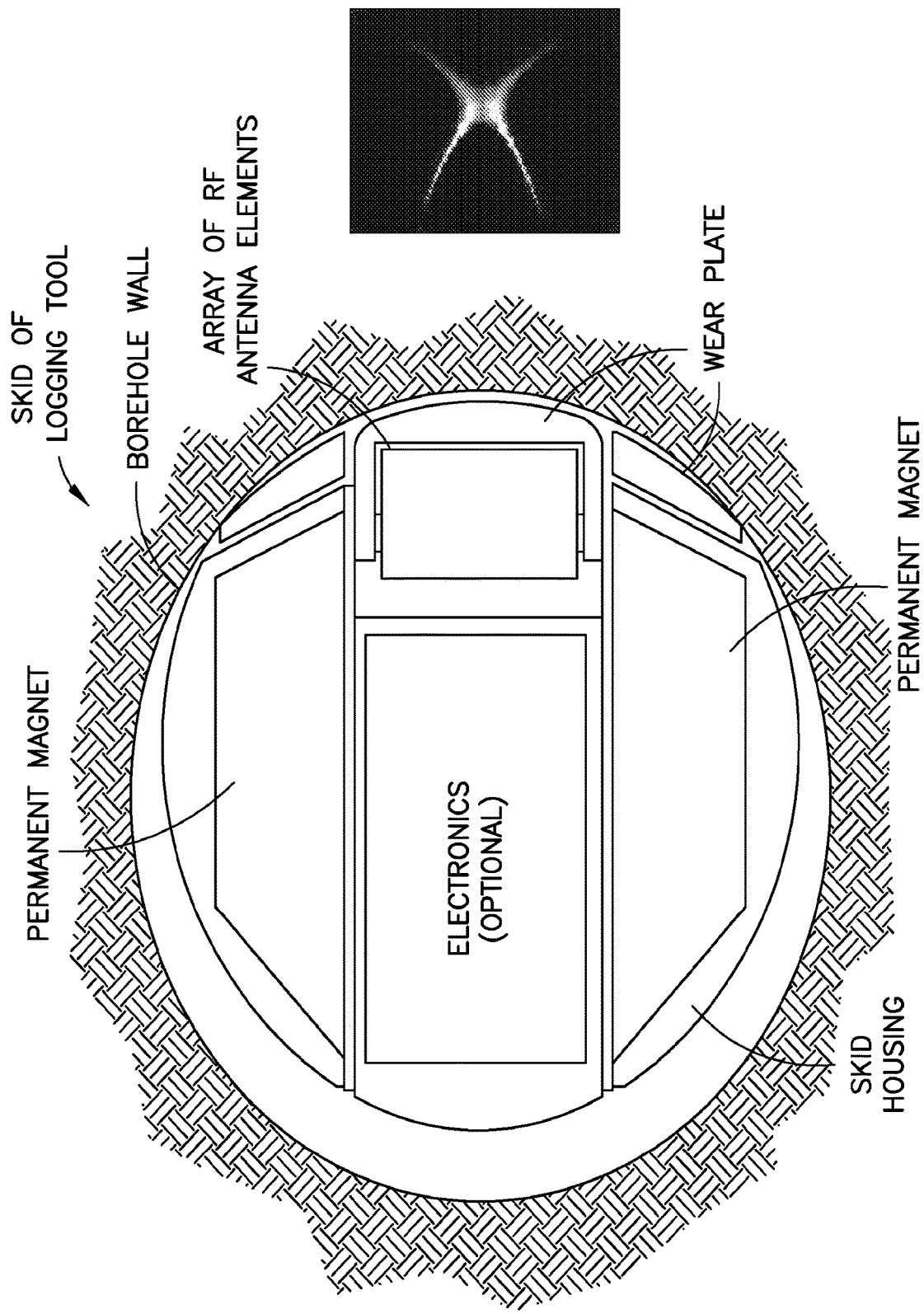

FIGS. 15A and 15B are schematic diagrams of an NMR logging tool similar to the logging tool 20 described above with respect to FIG. 14. As shown in FIG. 15A, the tool is approximately 14 feet in length and includes a bowspring eccentralizer at or near one end (top end) and a skid at the opposite end (bottom end). The bowspring eccentralizer can be configured to press the skid of the tool against the borehole wall during logging. The skid and the bowspring eccentralizer help compensate for the rugosity of the borehole while keeping the tool skid positioned closely to the side of the borehole under investigation.

FIG. 15B is a schematic cross-sectional diagram of the skid of the NMR logging tool of FIG. 15A positioned against a borehole wall. The skid housing supports a sensor that includes permanent magnets positioned on opposite sides of an array of RF antenna elements. Wear plates cover the array of RF antenna elements and adjacent sections of the skid housing. The permanent magnets generate a static magnetic field $B_0$ having a static field direction substantially perpendicular (90°) to the longitudinal axis of the tool. The RF antenna elements of the array are disposed along the length dimension of the skid housing. For example, the array of RF antenna elements described above with respect to FIGS. 10A, 10B and 10C can be disposed along the 6-inch length dimension of the skid housing as shown in FIG. 15A. In the embodiment of FIGS. 15A and 15B, each RF antenna element of the array generates an oscillating RF magnetic field $B_1$ in the region under investigation (or sensitive zone) that is substantially perpendicular to both the longitudinal axis of the tool and to the primary static field direction.

The NMR logging tool also includes an electronics cartridge that is housed within the tool body above the skid housing as shown in FIG. 15A. Part or all of the electronics of the system as described herein (such as one or more low-power PSC/ASICs, one or more high-power modules or parts thereof, and/or one or more tuning capacitors) can be supported within the skid housing as part of the sensor. For example, such electronics or parts thereof can optionally be disposed in the space between the permanent magnets of the sensor behind the array of RF antenna elements as shown in FIG. 15B. The electronics of the system is operably coupled to the array of RF antenna elements and is configured to cooperate with the array of RF antenna elements to make a measurement in the region of investigation (sensitive zone). Such measurements involve magnetically reorienting the nuclear spins of particles in the formation with pulses of the oscillating magnetic field $B_1$ transmitted by the RF antenna elements of the array and then detecting the NMR signals received by the RF antenna elements of the array which result from the precession of the tipped particles in the static magnetic field $B_0$ within the region of investigation over a period of time. Embodiments of the electronics of the system is described above with respect to FIGS. 2, 11, 12 and 13.

In other embodiments, the sensor of the NMR logging tool need not have a permanent magnet. In these embodiments, the earth's built-in magnetic field or some other tool or downhole equipment can provide the static magnetic field for the NMR measurements.

Some of the methods and processes described above, can be performed by a processor. The term "processor" should not be construed to limit the embodiments disclosed herein to any particular device type or system. The processor may include a computer system. The computer system may also include a computer processor (e.g., a microprocessor, microcontroller, digital signal processor, or general purpose computer) for executing any of the methods and processes described above.

The computer system may further include a memory such as a semiconductor memory device (e.g., a RAM, ROM, PROM, EEPROM, or Flash-Programmable RAM), a magnetic memory device (e.g., a diskette or fixed disk), an optical memory device (e.g., a CD-ROM), a PC card (e.g., PCMCIA card), or other memory device.

Some of the methods and processes described above, can be implemented as computer program logic for use with the computer processor. The computer program logic may be embodied in various forms, including a source code form or a computer executable form. Source code may include a series of computer program instructions in a variety of programming languages (e.g., an object code, an assembly language, or a high-level language such as C, C++, or JAVA). Such computer instructions can be stored in a non-transitory computer readable medium (e.g., memory)

and executed by the computer processor. The computer instructions may be distributed in any form as a removable storage medium with accompanying printed or electronic documentation (e.g., shrink wrapped software), preloaded with a computer system (e.g., on system ROM or fixed disk), or distributed from a server or electronic bulletin board over a communication system (e.g., the Internet or World Wide Web).

Alternatively or additionally, the processor may include discrete electronic components coupled to a printed circuit board, integrated circuitry (e.g., Application Specific Integrated Circuits (ASIC)), and/or programmable logic devices (e.g., a Field Programmable Gate Arrays (FPGA)). Any of the methods and processes described above can be implemented using such logic devices.

The components, steps, features, objects, benefits and advantages that have been disclosed are merely illustrative. None of them, nor the discussions relating to them, are intended to limit the scope of protection in any way. Numerous other embodiments are also contemplated, including embodiments that have fewer, additional, and/or different components, steps, features, objects, benefits and advantages.

Nothing that has been stated or illustrated is intended to cause a dedication of any component, step, feature, object, benefit, advantage, or equivalent to the public. While the specification describes particular embodiments of the present disclosure, those of ordinary skill can devise variations of the present disclosure without departing from the inventive concepts disclosed in the disclosure.

In the present application, reference to an element in the singular is not intended to mean "one and only one" unless specifically so stated, but rather "one or more." All structural and functional equivalents to the elements of the various embodiments described throughout this disclosure, known or later come to be known to those of ordinary skill in the art, are expressly incorporated herein by reference.

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims.

Although only a few example embodiments have been described in detail above, those skilled in the art will readily appreciate that many modifications are possible in the example embodiments without materially departing from this invention. Accordingly, all such modifications are intended to be included within the scope of this disclosure as defined in the following claims. In the claims, means-plus-function clauses are intended to cover the structures described herein as performing the recited function and not only structural equivalents, but also equivalent structures. Thus, although a nail and a screw may not be structural equivalents in that a nail employs a cylindrical surface to secure wooden parts together, whereas a screw employs a helical surface, in the environment of fastening wooden parts, a nail and a screw may be equivalent structures. It is the express intention of the applicant not to invoke 35 U.S.C. § 112, paragraph 6 for any limitations of any of the claims herein, except for those in which the claim expressly uses the words 'means for' together with an associated function.

What is claimed is:

1. An NMR well logging tool comprising:
a sensor comprising an array of RF antenna elements; and electronic circuitry that includes at least one low-power integrated circuit and a plurality of high-power modules corresponding the RF antenna elements of the array, wherein each high-power module is coupled to a corresponding RF antenna element of the array and includes an RF amplifier that is configured to amplify RF pulses generated by the at least one low-power integrated circuit and supplied thereto for transmission by the corresponding antenna element, wherein each RF antenna element of the array comprises an elongate ferrite core, an elongate or strip conductor element that extends along a length dimension of the ferrite core on one side of the ferrite core, and an exterior shield that surrounds the RF antenna element with an opening that exposes the elongate conductor, the RF antenna element being configured in use to produce an oscillating RF magnetic field in the space above the opening defined by the exterior shield.

2. An NMR well logging tool according to claim 1, wherein:
the sensor further comprises at least one magnet.

3. An NMR tool according to claim 1, wherein:
the sensor comprises a housing that at least partially encloses the array of RF antenna elements, wherein at least part of the electronic circuitry is enclosed within the housing.

4. An NMR well logging tool according to claim 1, wherein:
the RF amplifier of each high-power module comprises an H-bridge circuit.

5. An NMR well logging tool according to claim 4, wherein:
the H-bridge circuit comprises four switching transistors that are specified to operate at downhole temperatures up to 175° C.

6. An NMR well logging tool according to claim 5, wherein:
the four switching transistors that are realized from large bandgap semiconductor materials, such silicon-carbide (SiC), gallium-nitride (GaN), or other hybrid semiconductor material.

7. An NMR logging tool according to claim 6, wherein:
the H-bridge circuit is operably coupled to a direct-current power supply that supplies a DC high voltage power supply signal of at least 50 volts.

8. An NMR logging tool according to claim 1, wherein:
at least one the plurality of high-power modules is realized by an integrated circuit, multi-chip module or small-size printed circuit board.

9. An NMR logging tool according to claim 1, wherein:
the at least one low-power integrated circuit includes at least one pulse sequence generator circuit and a plurality of RF transmitter circuits corresponding to the plurality of high-power modules, wherein each RF transmitter circuit is configured to generate a low-power RF oscillating signal under control of the at least one pulse sequence generator circuit for supply to the RF amplifier of the corresponding high-power module.

10. An NMR logging tool according to claim 9, wherein:
the at least one low-power integrated circuit includes a single low-power integrated circuit that includes a pulse sequence generator circuit and a plurality of RF transmitter circuits corresponding to the plurality of high-power modules, wherein each RF transmitter circuit is configured to generate a low-power RF oscillating signal under control of the pulse sequence generator circuit for supply to the RF amplifier of the corresponding high-power module.

11. An NMR logging tool according to claim 9, wherein:
the at least one low-power integrated circuit includes a plurality of low-power integrated circuits corresponding to the plurality of high-power modules, wherein each low-power integrated circuit includes a pulse sequence generator circuit and an RF transmitter circuit operably coupled to a corresponding high-power module, wherein the RF transmitter circuit is configured to generate a low-power RF oscillating signal under control of the pulse sequence generator circuit for supply to the RF amplifier of the corresponding high-power module.

12. An NMR logging tool according to claim 11, wherein:
operation of the plurality of low-power integrated circuits is synchronized by timing control signals communicated therebetween.

13. An NMR logging tool according to claim 1, wherein:
each high-power module further includes a duplexer circuit operably coupled between the RF amplifier of the high-power module and the corresponding RF antenna element of the array.

14. An NMR logging tool according to claim 13, wherein:
the at least one low-power integrated circuit further includes a plurality of RF receiver circuits corresponding to the plurality of high-power modules;
the duplexer circuit of each high-power module is operably coupled between the corresponding RF antenna element of the array and the corresponding RF receiver circuit; and
each RF receiver circuit is configured to receive NMR signal components detected by the RF antenna element coupled to the duplexer circuit of the corresponding high-power module.

15. An NMR logging tool according to claim 14, wherein:
the at least one low-power integrated circuit includes a single low-power integrated circuit that includes a plurality of RF receiver circuits corresponding to the plurality of high-power modules, wherein each RF receiver circuit is configured to receive NMR signal components detected by the RF antenna element coupled to the duplexer circuit of the corresponding high-power module.

16. An NMR logging tool according to claim 14, wherein:
the at least one low-power integrated circuit includes a plurality of low-power integrated circuits corresponding to the plurality of high-power modules, wherein each low-power integrated circuit includes an RF receiver circuit operably coupled to a corresponding high-power module, wherein the RF receiver circuit is configured to receive NMR signal components detected by the RF antenna element coupled to the duplexer circuit of the corresponding high-power module.

17. An NMR logging tool according to claim 16, further comprising:
a control module operably coupled to the plurality of low-power integrated circuits, which is configured to store NMR data corresponding to the received NMR signal components for the plurality of low-power integrated circuits in at least one memory device.

18. An NMR logging tool according to claim 16, wherein:
the control module stores NMR data corresponding to the received NMR signal components for the plurality of low-power integrated circuits in different memory devices corresponding to the plurality of low-power integrated circuits.

19. An NMR logging tool according to claim 1, wherein:
the at least one low-power integrated circuit comprises an ASIC or a plurality of ASICs.

\* \* \* \* \*